United States Patent
Watson, Jr. et al.

(10) Patent No.: US 11,537,106 B2
(45) Date of Patent: Dec. 27, 2022

(54) VEHICLE COMPUTING SYSTEM COOLING SYSTEMS

(71) Applicant: UATC, LLC, Mountain View, CA (US)

(72) Inventors: Thomas Jeffery Watson, Jr., Pittsburgh, PA (US); Scott Klaus Boehmke, Wexford, PA (US)

(73) Assignee: UATC, LLC, Mountain View, CA (US)

( * ) Notice: Subject to any disclaimer, the term of this patent is extended or adjusted under 35 U.S.C. 154(b) by 0 days.

(21) Appl. No.: 17/462,919

(22) Filed: Aug. 31, 2021

(65) Prior Publication Data

US 2022/0019194 A1 Jan. 20, 2022

Related U.S. Application Data

(63) Continuation of application No. 16/832,675, filed on Mar. 27, 2020, now Pat. No. 11,126,165.

(Continued)

(51) Int. Cl.
*G06F 1/16* (2006.01)
*H05K 5/00* (2006.01)
(Continued)

(52) U.S. Cl.
CPC ....... *G05B 19/416* (2013.01); *G05B 19/4155* (2013.01); *G06F 1/20* (2013.01); *H05K 7/20845* (2013.01); *G05B 2219/49216* (2013.01)

(58) Field of Classification Search
CPC .......... H05K 7/20845; H05K 7/20854; H05K 7/20863; H05K 7/20872; H05K 7/20881; H05K 7/20; G05B 19/416
See application file for complete search history.

(56) References Cited

U.S. PATENT DOCUMENTS

| 4,408,714 A | 10/1983 | Kobayashi |
| 4,741,477 A | 5/1988 | Ito |

(Continued)

FOREIGN PATENT DOCUMENTS

| CN | 101900393 | 12/2010 |
| CN | 102101426 | 6/2011 |

(Continued)

OTHER PUBLICATIONS

Cerullo, "Keeping your car heater hot", Popular Science, vol. 223, No. 6, Dec. 1983, pp. 122-124.

(Continued)

*Primary Examiner* — Anthony M Haughton
(74) *Attorney, Agent, or Firm* — Dority & Manning, P.A.

(57) ABSTRACT

Systems and methods for cooling a vehicle computing system are provided. A computing system can include a first cooling baseplate including a first planar cooling surface and a second cooling baseplate including a second planar cooling surface. The computing system can further include one or more computing devices including a processor blade positioned on the first planar cooling surface, a coprocessor blade positioned on the second planar cooling surface, and a flexible connector coupled between the processor blade and the coprocessor blade. The flexible connector can be configured to transfer at least one of data or electric power between the processor blade and the coprocessor blade. The first planar cooling surface can be configured to transfer heat from the processor blade to a cooling fluid via conduction. The second planar cooling surface can be configured to transfer heat from the coprocessor blade to the cooling fluid via conduction.

20 Claims, 8 Drawing Sheets

Related U.S. Application Data

(60) Provisional application No. 62/972,955, filed on Feb. 11, 2020.

(51) Int. Cl.
*H05K 7/00* (2006.01)
*G05B 19/416* (2006.01)
*H05K 7/20* (2006.01)
*G05B 19/4155* (2006.01)
*G06F 1/20* (2006.01)

(56) References Cited

U.S. PATENT DOCUMENTS

| | | | |
|---|---|---|---|
| 5,537,956 A | 7/1996 | Rennfeld | |
| 5,590,540 A | 1/1997 | Ikeda | |
| 5,756,157 A | 5/1998 | Kannan | |
| 6,021,371 A | 2/2000 | Fultz | |
| 6,112,807 A | 9/2000 | Dage | |
| 6,238,725 B1 | 5/2001 | Bush | |
| 6,282,911 B1 | 9/2001 | Watanabe | |
| 6,360,835 B1 | 3/2002 | Skala | |
| 6,367,272 B1 | 4/2002 | Zeng | |
| 6,394,207 B1 | 5/2002 | Skala | |
| 6,606,251 B1 | 8/2003 | Kenny, Jr. | |
| 6,622,500 B1 | 9/2003 | Archibald | |
| 7,191,858 B2 | 3/2007 | Vanderwees | |
| 7,404,461 B2 | 7/2008 | Varenne | |
| 7,424,868 B2 | 9/2008 | Reckels | |
| 8,263,006 B2* | 9/2012 | Sutherland | B01J 19/2485 422/600 |
| 8,373,099 B2 | 2/2013 | Lifson | |
| 8,402,776 B2 | 3/2013 | Johnston | |
| 8,467,188 B2* | 6/2013 | Hsieh | H05K 7/20927 361/698 |
| 8,599,001 B2 | 12/2013 | Schofield | |
| 8,820,351 B1 | 9/2014 | Harrington | |
| 8,989,954 B1 | 3/2015 | Addepalli | |
| 9,219,295 B2 | 12/2015 | Weng | |
| 9,227,482 B2 | 1/2016 | DiGasbarro | |
| 9,445,526 B2* | 9/2016 | Zhou | H05K 7/20272 |
| 9,820,409 B1 | 11/2017 | Ross | |
| 9,869,982 B1 | 1/2018 | Clidaras | |
| 10,214,109 B2* | 2/2019 | Gohara | B60K 1/00 |
| 10,481,652 B2* | 11/2019 | Rice | H05K 7/20881 |
| 10,784,793 B2* | 9/2020 | Chung | H02M 1/44 |
| 10,850,623 B2* | 12/2020 | Chung | B60L 15/007 |
| 2003/0121649 A1* | 7/2003 | Seiler | F28F 9/0278 29/890.03 |
| 2004/0190255 A1 | 9/2004 | Cheon | |
| 2005/0083655 A1* | 4/2005 | Jairazbhoy | H01L 23/3733 257/E23.098 |
| 2007/0258216 A1 | 11/2007 | McBain | |
| 2007/0261648 A1 | 11/2007 | Reckels | |
| 2008/0023248 A1 | 1/2008 | Bradley | |
| 2008/0112571 A1 | 5/2008 | Bradicich | |
| 2008/0139102 A1 | 6/2008 | Major | |
| 2008/0186670 A1 | 8/2008 | Lyon | |
| 2008/0251235 A1 | 10/2008 | Zhou | |
| 2008/0271878 A1 | 11/2008 | Harvey | |
| 2009/0020620 A1 | 1/2009 | Douarre | |
| 2009/0071178 A1 | 3/2009 | Major | |
| 2009/0138544 A1 | 5/2009 | Wegenkittl | |
| 2009/0140417 A1 | 6/2009 | Refai-Ahmed | |
| 2009/0145674 A1 | 6/2009 | Lee | |
| 2009/0279247 A1 | 11/2009 | Chen | |
| 2009/0301125 A1 | 12/2009 | Myles | |
| 2010/0032150 A1 | 2/2010 | Determan | |
| 2010/0100306 A1 | 4/2010 | Gamache | |
| 2010/0230505 A1 | 9/2010 | Ribadeneira | |
| 2010/0262301 A1 | 10/2010 | Schwartz | |
| 2010/0292976 A1 | 11/2010 | Newcombe | |
| 2010/0305794 A1 | 12/2010 | Foster | |
| 2010/0316255 A1 | 12/2010 | Mathony | |
| 2011/0114739 A1 | 5/2011 | Misumi | |
| 2011/0154324 A1 | 6/2011 | Pagan | |
| 2011/0176279 A1 | 7/2011 | Zhao | |
| 2011/0246023 A1 | 10/2011 | Lockwood | |
| 2012/0087088 A1 | 4/2012 | Killion | |
| 2012/0138281 A1* | 6/2012 | Santini | H05K 7/20927 165/170 |
| 2012/0143430 A1 | 6/2012 | Broggi | |
| 2012/0180979 A1 | 7/2012 | Harrington | |
| 2012/0205088 A1 | 8/2012 | Morisita | |
| 2012/0316711 A1 | 12/2012 | Christian | |
| 2013/0231824 A1 | 9/2013 | Wilson | |
| 2013/0238233 A1 | 9/2013 | Kim | |
| 2013/0255601 A1 | 10/2013 | Gooden | |
| 2013/0261942 A1 | 10/2013 | Mcquade | |
| 2013/0306276 A1 | 11/2013 | Duchesneau | |
| 2014/0157803 A1 | 6/2014 | Pebley | |
| 2014/0217080 A1 | 8/2014 | Hoke | |
| 2014/0229059 A1 | 8/2014 | Surnilla | |
| 2014/0260233 A1 | 9/2014 | Giovanardi | |
| 2014/0350768 A1 | 11/2014 | Filippov | |
| 2014/0371924 A1 | 12/2014 | Kodama | |
| 2015/0122465 A1 | 5/2015 | Mori | |
| 2015/0142244 A1 | 5/2015 | You | |
| 2015/0242944 A1 | 8/2015 | Willard | |
| 2015/0245539 A1 | 8/2015 | Pelletier | |
| 2015/0251741 A1 | 9/2015 | Cantwell | |
| 2015/0285645 A1 | 10/2015 | Maise | |
| 2015/0316334 A1 | 11/2015 | Chainer | |
| 2015/0323940 A1 | 11/2015 | Venkatesan | |
| 2015/0339928 A1 | 11/2015 | Ramanujam | |
| 2015/0348335 A1 | 12/2015 | Ramanujam | |
| 2015/0348869 A1* | 12/2015 | Joshi | H01L 25/07 165/104.31 |
| 2015/0354902 A1 | 12/2015 | McDonald | |
| 2016/0120019 A1 | 4/2016 | Shedd | |
| 2016/0167653 A1 | 6/2016 | Malone | |
| 2016/0247106 A1 | 8/2016 | Dalloro | |
| 2016/0264132 A1 | 9/2016 | Paul | |
| 2016/0314429 A1 | 10/2016 | Gillen | |
| 2017/0168531 A1 | 6/2017 | Casparian | |
| 2017/0264493 A1 | 9/2017 | Cencini | |
| 2017/0313158 A1 | 11/2017 | Porras | |
| 2018/0050704 A1 | 2/2018 | Tascione | |
| 2018/0188726 A1 | 7/2018 | Newman | |
| 2018/0209324 A1 | 7/2018 | Schwartz | |
| 2018/0212687 A1 | 7/2018 | Westmeyer | |
| 2018/0258900 A1 | 9/2018 | Namuduri | |
| 2018/0357554 A1 | 12/2018 | Hazan | |
| 2018/0370540 A1 | 12/2018 | Yousuf | |
| 2018/0372504 A1 | 12/2018 | Singhal | |
| 2019/0031015 A1 | 1/2019 | Borud | |

FOREIGN PATENT DOCUMENTS

| | | |
|---|---|---|
| CN | 103346661 | 10/2013 |
| CN | 103863136 | 6/2014 |
| CN | 104477024 | 4/2015 |
| CN | 104508274 | 4/2015 |
| CN | 104589958 | 5/2015 |
| DE | 102009048674 | 5/2010 |
| WO | WO2005053974 | 6/2005 |

OTHER PUBLICATIONS

Elma Electronics Inc., "3U Open VPX, Rugged ATR", Elma Solution Partner, http://www.elma.com, retrieved on Jan. 30, 2018, 2 pages.
Extended European Search Report for 16879958.3, dated Dec. 20, 2018, 7 pages.
International Search Report and Written Opinion for Application No. PCT/US2018/063252, dated Feb. 15, 2019, 13 pages.
International Search Report and Written Opinion for Application No. PCT/US2021/017538, dated Jun. 21, 2021, 18 pages.
International Search Report and Written Opinion for PCT/US2016/067718, dated Mar. 20, 2017 10 pages.
International Search Report with Written Opinion for PCT/US2017/068104 dated Apr. 13, 2018, 13 pages.

(56) References Cited

OTHER PUBLICATIONS

Moll, "VXS and VPX: Cooling These Hot (Literally) New Architectures in ATRs", VITA Technologies, http://www.vita.mil-embedded. com/articles/vxs-vpx-literally-new-architectures-atrs/, retrieved on Jan. 30, 2018, 6 pages.

* cited by examiner

VEHICLE COMPUTING SYSTEM COOLING SYSTEMS

PRIORITY CLAIM

The present application is a continuation of U.S. patent application Ser. No. 16/832,675, titled "Vehicle Computing System Cooling Systems," having a filing date of Mar. 27, 2020, which is based on and claims the benefit of priority to U.S. Provisional Application 62/972,955 having a filing date of Feb. 11, 2020, which is incorporated by reference herein.

FIELD

The present disclosure relates generally to devices, systems, and methods for cooling an autonomous vehicle computing system.

BACKGROUND

An autonomous vehicle is a vehicle that is capable of sensing its environment and navigating with minimal or no human input. In particular, an autonomous vehicle can observe its surrounding environment using a variety of sensors and can attempt to comprehend the environment by performing various processing techniques on data collected by the sensors. Given knowledge of its surrounding environment, the autonomous vehicle can identify an appropriate motion path through such surrounding environment.

SUMMARY

Aspects and advantages of embodiments of the present disclosure will be set forth in part in the following description, or can be learned from the description, or can be learned through practice of the embodiments.

One example aspect is directed to an autonomous vehicle computing system. The autonomous vehicle computing system can include a first cooling baseplate. The first cooling baseplate can include a first planar cooling surface, a first external housing oriented substantially parallel to the first planar cooling surface, an inlet configured to receive a cooling fluid, an outlet, and at least one cooling channel coupled between the inlet and the outlet. The at least one cooling channel can be positioned between the first planar cooling surface and the first external housing. The at least one cooling channel can be configured to allow the cooling fluid to flow between the inlet and the outlet and provide cooling to the first planar cooling surface. The autonomous vehicle computing system can further include a second cooling baseplate. The second cooling baseplate can include a second planar cooling surface, a second external housing oriented substantially parallel to the second planar cooling surface, an inlet configured to receive the cooling fluid, an outlet, and at least one cooling channel coupled between the inlet and the outlet. The at least one cooling channel can be positioned between the second planar cooling surface and the second external housing. The at least one cooling channel can be configured to allow the cooling fluid to flow between the inlet and the outlet and provide cooling to the second planar cooling surface. The autonomous vehicle computing system can further include a cooling fluid connector coupled between the outlet of the first cooling baseplate and the inlet of the second cooling baseplate. The fluid connector can be configured to allow the cooling fluid to flow from the first outlet of the first cooling baseplate to the inlet of the second cooling baseplate. The autonomous vehicle computing system can further include one or more computing devices. Each computing device can include a processor blade. The processor blade can include a processor. The processor blade can be positioned on the first planar cooling surface in a surface-mounted orientation parallel to the first planar cooling surface. Each computing device can further include a coprocessor carrier comprising one or more coprocessor blades. Each of the one or more coprocessor blades can include at least one coprocessor. The one or more coprocessor blades can be positioned on the second planar cooling surface in a surface-mounted orientation parallel to the second planar cooling surface. Each computing device can further include a flexible connector coupled between the processor blade and at least one of the one or more coprocessor blades. The flexible connector can be configured to transfer at least one of data or electric power between the processor blade and the at least one coprocessor blade.

Another example aspect of the present disclosure is directed to a computing system. The computing system can include a cooling fluid source. The cooling fluid source can be configured to provide a cooling fluid. The computing system can further include an autonomous vehicle computing system. The autonomous vehicle computing system can include a first cooling baseplate. The first cooling baseplate can include a first planar cooling surface, a first external housing oriented substantially parallel to the first planar cooling surface, an inlet configured to receive a cooling fluid, an outlet, and at least one cooling channel coupled between the inlet and the outlet. The at least one cooling channel can be positioned between the first planar cooling surface and the first external housing. The at least one cooling channel can be configured to allow the cooling fluid to flow between the inlet and the outlet and provide cooling to the first planar cooling surface. The autonomous vehicle computing system can further include a second cooling baseplate. The second cooling baseplate can include a second planar cooling surface, a second external housing oriented substantially parallel to the second planar cooling surface, an inlet configured to receive the cooling fluid, an outlet, and at least one cooling channel coupled between the inlet and the outlet. The at least one cooling channel can be positioned between the second planar cooling surface and the second external housing. The at least one cooling channel can be configured to allow the cooling fluid to flow between the inlet and the outlet and provide cooling to the second planar cooling surface. The autonomous vehicle computing system can further include a cooling fluid connector coupled between the outlet of the first cooling baseplate and the inlet of the second cooling baseplate. The fluid connector can be configured to allow the cooling fluid to flow from the first outlet of the first cooling baseplate to the inlet of the second cooling baseplate. The autonomous vehicle computing system can further include one or more computing devices. Each computing device can include a processor blade. The processor blade can include a processor. The processor blade can be positioned on the first planar cooling surface in a surface-mounted orientation parallel to the first planar cooling surface. Each computing device can further include a coprocessor carrier comprising one or more coprocessor blades. Each of the one or more coprocessor blades can include at least one coprocessor. The one or more coprocessor blades can be positioned on the second planar cooling surface in a surface-mounted orientation parallel to the second planar cooling surface. Each computing device can further include a flexible connector coupled between the processor blade and at least one of the one or more coprocessor blades. The flexible connector can be configured to transfer at least one of data or electric power between the processor blade and the at least one coprocessor blade. The first planar cooling surface can be configured to transfer heat from the processor blade to the cooling fluid via conduction. The second planar cooling surface can be configured to transfer heat from the one or more coprocessor blades to the cooling fluid via conduction.

Another example aspect of the present disclosure is directed to an autonomous vehicle. The autonomous vehicle can include a cooling fluid source. The cooling fluid source can be configured to provide a cooling fluid. The autonomous vehicle can further include an autonomous vehicle computing system. The autonomous vehicle computing system can include a first cooling baseplate. The first cooling baseplate can include a first planar cooling surface, a first external housing oriented substantially parallel to the first planar cooling surface, an inlet configured to receive a cooling fluid, an outlet, and at least one cooling channel coupled between the inlet and the outlet. The at least one cooling channel can be positioned between the first planar cooling surface and the first external housing. The at least one cooling channel can be configured to allow the cooling fluid to flow between the inlet and the outlet and provide cooling to the first planar cooling surface. The autonomous vehicle computing system can further include a second cooling baseplate. The second cooling baseplate can include a second planar cooling surface, a second external housing oriented substantially parallel to the second planar cooling surface, an inlet configured to receive the cooling fluid, an outlet, and at least one cooling channel coupled between the inlet and the outlet. The at least one cooling channel can be positioned between the second planar cooling surface and the second external housing. The at least one cooling channel can be configured to allow the cooling fluid to flow between the inlet and the outlet and provide cooling to the second planar cooling surface. The autonomous vehicle computing system can further include a cooling fluid connector coupled between the outlet of the first cooling baseplate and the inlet of the second cooling baseplate. The fluid connector can be configured to allow the cooling fluid to flow from the first outlet of the first cooling baseplate to the inlet of the second cooling baseplate. The autonomous vehicle computing system can further include one or more computing devices. Each computing device can include a processor blade. The processor blade can include a processor. The processor blade can be positioned on the first planar cooling surface in a surface-mounted orientation parallel to the first planar cooling surface. Each computing device can further include a coprocessor carrier comprising one or more coprocessor blades. Each of the one or more coprocessor blades can include at least one coprocessor. The one or more coprocessor blades can be positioned on the second planar cooling surface in a surface-mounted orientation parallel to the second planar cooling surface. Each computing device can further include a flexible connector. The flexible connector can include a layer of film coated with a plurality of strands. The flexible connector can be coupled between the processor blade and at least one of the one or more coprocessor blades. The flexible connector can be configured to transfer at least one of data or electric power between the processor blade and the at least one coprocessor blade.

Other aspects of the present disclosure are directed to various systems, apparatuses, non-transitory computer-readable media, vehicles, and computing devices.

The autonomous vehicle technology described herein can help improve the safety of passengers of an autonomous vehicle, improve the safety of the surroundings of the autonomous vehicle, improve the experience of the rider and/or operator of the autonomous vehicle, as well as provide other improvements as described herein. Moreover, the autonomous vehicle technology of the present disclosure can help improve the ability of an autonomous vehicle to effectively provide vehicle services to others and support the various members of the community in which the autonomous vehicle is operating, including persons with reduced mobility and/or persons that are underserved by other transportation options. Additionally, the autonomous vehicle of the present disclosure may reduce traffic congestion in communities as well as provide alternate forms of transportation that may provide environmental benefits.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

DETAILED DESCRIPTION

Figure 1:
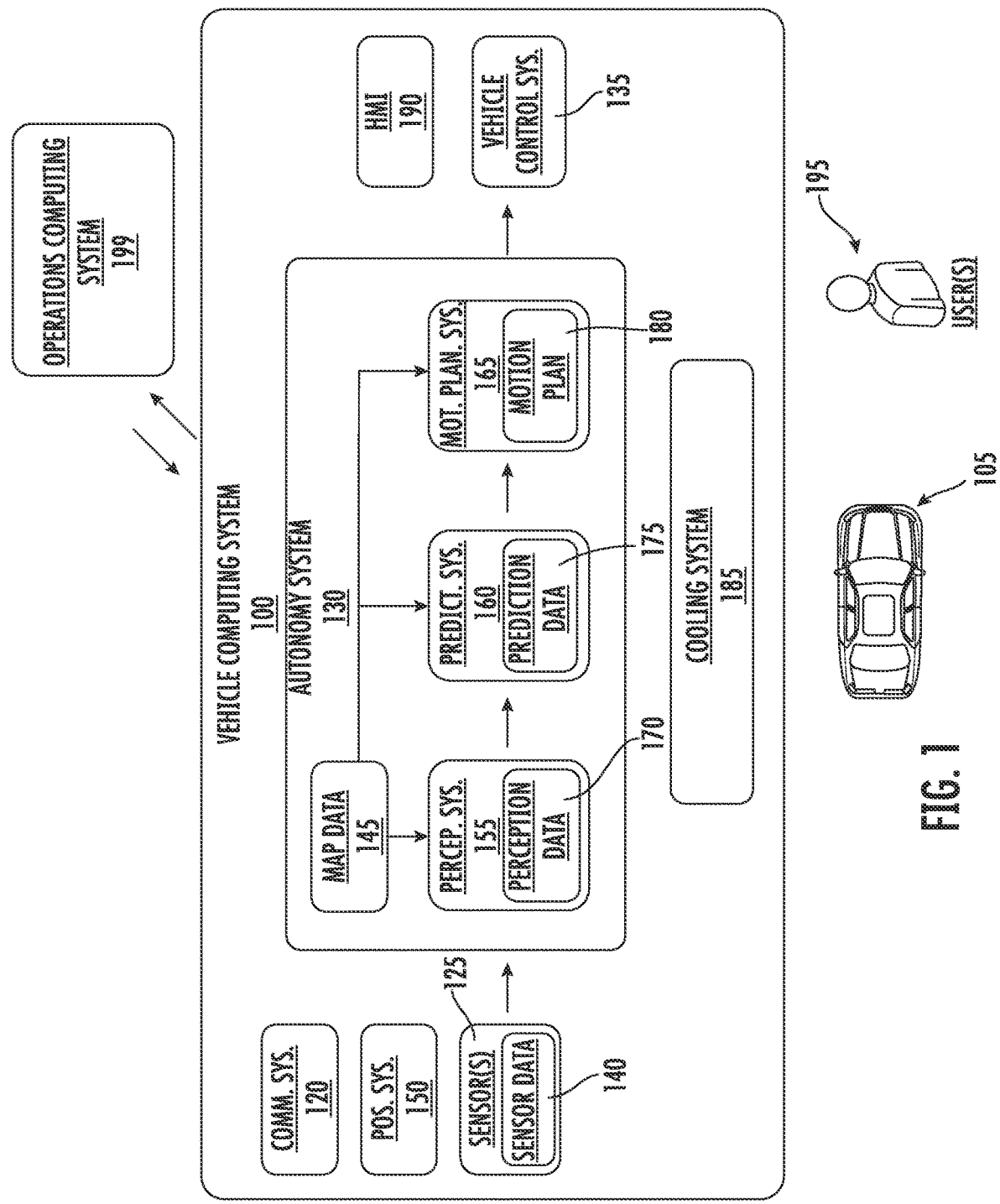
FIG. 1 depicts an example autonomous vehicle according to example aspects of the present disclosure.

Example aspects of the present disclosure are directed to devices and systems for cooling an autonomous vehicle computing system. For example, in some implementations, an autonomous vehicle computing system can include a cooling baseplate. The cooling baseplate can include a first planar cooling surface and a second planar cooling surface oriented substantially parallel to the first planar cooling surface. The cooling baseplate can further include an inlet configured to receive a cooling fluid, an outlet, and at least one cooling channel coupled between the inlet and the outlet. The at least one cooling channel can be positioned between the first planar cooling surface and the second planar cooling surface. A cooling fluid can flow between the inlet and the outlet to provide cooling to both the first planar cooling surface and the second planar cooling surface. The autonomous vehicle computing system can further include one or more computing devices. Each computing device can include a processor blade, which can include a processor. The processor blade can be positioned on the first planar cooling surface in a surface-mounted orientation parallel to the first planar cooling surface. Each computing device can further include one or more coprocessor blades, which can include at least one coprocessor. The one or more coprocessor blades can be positioned on the second planar cooling surface in a surface-mounted orientation parallel to the second planar cooling surface. A flexible connector can be coupled between the processor blade in at least one of the one or more coprocessor blades. The flexible connector can be configured to transfer at least one of data and/or electric power between the processor blade and the at least one coprocessor blade. The first planar cooling surface can be configured to transfer heat from the processor blade to the cooling fluid via conduction, and the second planar cooling surface can be configured to transfer heat from the one or more coprocessor blades to the cooling fluid via conduction.

More particularly, in some implementations, an autonomous vehicle can include a computing system which may need to be operated within a specified temperature range. For example, the vehicle computing system can assist in controlling the autonomous vehicle. The autonomous vehicle can be a ground-based autonomous vehicle (e.g., car, truck, bus, light electric vehicle, etc.), an air-based autonomous vehicle (e.g., airplane, drone, helicopter, or other aircraft), or other types of vehicles (e.g., watercraft). In some implementations, the vehicle computing system can include a vehicle autonomy system which includes one or more subsystems. For example, the vehicle autonomy system can include a perception system, a prediction system, and a motion planning system that cooperate to perceive the surrounding environment of the autonomous vehicle and determine a motion plan for controlling the motion of the autonomous vehicle accordingly.

For example, one or more sensors of the autonomous vehicle can obtain sensor data associated with one or more objects within the surrounding environment of the autonomous vehicle. The perception system can receive the sensor data and generate state data descriptive of the one or more objects, such as data describing the position, velocity, heading, acceleration, size, type, etc. for each object. The perception system can provide the state data indicative of the one or more objects to the prediction system, which can determine a predicted future state for each object perceived by the perception system. The motion planning system can determine a motion plan for the autonomous vehicle based on the objects within the surrounding environment, the predicted future states for the objects, and characteristics of the area in which the vehicle is travelling. A vehicle controller can control the motion of the autonomous vehicle based on the motion plan. In this way, an autonomous vehicle can perceive objects within a surrounding environment of autonomous vehicle, and, in response, control the autonomous vehicle accordingly.

In some implementations, the vehicle computing system can include one or more processors, coprocessors, memory devices, solid state drives (SSDs) and/or other computing components. For example, the autonomous vehicle computing system can include one or more computing devices. Each computing device can include, for example, a processor blade and one or more coprocessor blades. For example, a processor blade can include a circuit board (e.g., motherboard) on which can be mounted a processor (e.g., a central processing unit (CPU)), memory devices (e.g., RAM), and/or data storage devices (e.g., SSDs). A coprocessor blade can include, for example, a circuit board on which can be mounted a coprocessor, such as a graphics processing unit (GPU), an Application Specific Integrated Circuit (ASIC), or a field programmable gate array (FPGA). Each coprocessor (e.g., FPGA, GPU) can be used to supplement the functions of the processor (e.g., CPU) by, for example, performing intensive calculations such as image analysis. In some implementations, a plurality of coprocessor blades can each supplement a single processor. For example, in some implementations, two GPUs and a FPGA can each be configured to supplement a processor. In some implementations, a plurality of computing devices can be included in an autonomous vehicle computing system. For example, in some implementations, four computing devices can be included in an autonomous vehicle computing system.

The computing component(s) of the autonomous vehicle computing system may need to be operated below one or more temperature thresholds in order for the component(s) to operate safely and reliably without damaging the component(s). For example, in some implementations, operating a vehicle computing system at too high of a temperature may reduce the expected service life of the computing system or permanently damage the computing system, which in turn may require the system to be operated at a reduced frequency and/or performance setting in order to stay under any applicable thermal constraints.

According to example aspects of the present disclosure, an autonomous vehicle computing system can include a cooling baseplate configured to cool the autonomous vehicle computing system components. For example, in some implementations, the cooling baseplate can include a first planar cooling surface (e.g., a top) and a second planar cooling surface (e.g., a bottom) oriented substantially parallel to the first planar cooling surface. As used herein, the phrase "substantially parallel" can mean within 10 degrees of parallel, not accounting for any tolerances within the system. The cooling baseplate can further include an inlet and an outlet, and one or more cooling channels coupled between the inlet and the outlet, which can be positioned between the first planar cooling surface and the second planar cooling surface. The cooling baseplate can be manufactured by, for example, casting, milling, additive manufacturing, and/or other suitable process. The cooling baseplate can be constructed out of a thermally conductive material. For example, in various implementations, aluminum, copper, or other metals, including alloys, can be used to manufacture the cooling baseplate. For example, a first portion (e.g., a top portion) of a cooling baseplate can be milled from a block of aluminum to create one or more cooling channels positioned underneath a first planar cooling surface, and a second portion, (e.g., a bottom portion) can be brazed to the first portion to enclose the one or more cooling channels between the first planar cooling surface and the second planar cooling surface. Once enclosed, the one or more cooling channels can allow a coolant to flow through the cooling baseplate and provide cooling to both the top and the bottom portions of the cooling baseplate.

According to additional aspects of the present disclosure, a processor blade which includes a processor can be positioned on a first planar cooling surface in a surface-mounted orientation parallel to the first planar cooling surface. For example, in some implementations, a processor blade can be mounted on the first planar cooling surface using one or more fasteners (e.g., clips, screws, spring-loaded screws, etc.). In some implementations, a load spreader can be used to mount the processor blade to the first planar cooling surface which can assist in reducing stress on mounting locations of the processor blade. In some implementations, the processor of the processor blade can be directly coupled to the first planar cooling surface. For example, a thermally conductive compound, such as a thermal grease, can be applied to the processor, which can assist in conductively transferring heat from the processor to the first planar cooling surface.

According to additional aspects of the present disclosure, one or more coprocessor blades can be positioned on the second planar cooling surface. For example, a first coprocessor blade can include a GPU and a second coprocessor blade can include a FPGA, and both coprocessor blades can be positioned on the second planar cooling surface adjacent to one another. In some implementations, each coprocessor blade can include a heat spreader coupled between the coprocessor blade and the second planar cooling surface to assist in conductive heat transfer between the respective coprocessor and the second planar cooling surface. For example, a copper heat spreader or a vapor chamber can be positioned between the coprocessor and the second planar cooling surface. In some implementations, a thermally conductive compound, such as a thermal grease, can be applied to the coprocessor, which can assist in conductively transferring heat from the coprocessor to the second planar cooling surface. In some implementations, a coprocessor blade can be mounted on the second planar cooling surface using one or more fasteners (e.g., clips, screws, spring-loaded screws, etc.). In some implementations, a load spreader can be used to mount a coprocessor blade to the second planar cooling surface which can assist in reducing stress on mounting locations of the coprocessor blade.

According to additional aspects of the present disclosure, a flexible connector can be coupled between the processor blade and at least one of the coprocessor blades. The flexible connector can be a flexible circuit board and can be configured to transfer at least one of data or electric power between the processor blade and the at least one coprocessor blade. For example, in some implementations, the flexible connector can include a layer of polyimide film (e.g., Kapton) which can be coated with a plurality of copper strands and an insulative sealant. For example, the layer of polyimide film can be approximately 1.0 to 6.0 mils thick. As used herein, the term "approximately" can mean within 20% of the stated value. In some implementations, each of the plurality of copper strands can be approximately 0.2 to 2.0 mils thick. The copper strands can be, for example, individual copper strands corresponding to individual pins of a connector. In some implementations, a wide layer of copper can be used for electric power transfer. The insulative sealant can be applied on top of the copper strands in order to insulate the copper strands. Stated differently, the copper strands can be positioned (e.g., sealed) between the polyimide film and the insulative sealant.

In some implementations, a subset of copper strands can be positioned on a first side of the polyimide film, and a second subset of copper strands can be positioned on a second side of the polyimide film. Each subset can be coated with an insulative sealant. In this way, a flexible connector can be a two-sided flexible connector.

The relatively thin layer of polyimide film, layer(s) of copper strands, and layer(s) of insulative sealant can allow for the flexible connector to bend (e.g., flex). For example, the flexible connector can plug into a connector on the processor blade and wrap around the cooling baseplate to plug into a connector on one of the coprocessor blades. This can allow for the flexible connector to transfer data and/or electric power between the processor blade and the coprocessor blade.

In some implementations, a plurality of coprocessor blades can be included in a computing device to assist a single processor blade. For example, a first flexible connector can be coupled between the processor and a first coprocessor, and a second flexible connector can be coupled between the first coprocessor and a second coprocessor. In some implementations, the second flexible connector can include a preformed bend to allow for a variation or discrepancy in a mounting height of the first coprocessor blade and a mounting height of the second coprocessor blade. For example, due to variations in materials, manufacturing tolerances, etc., two coprocessor blades may be mounted at different heights on the second planar cooling surface. The preformed bends in a flexible connector can allow for each coprocessor blade to be securely mounted to the second planar cooling surface at their respective heights.

In in some implementations, the cooling baseplate can include an air gap and/or a fluid gap positioned between the first planar cooling surface and the second planar cooling surface. For example, a first subset of one or more cooling channels can be positioned adjacent to the first planar cooling surface, and a second subset of one or more cooling channels can be positioned adjacent to the second planar cooling surface. An air gap (e.g., an open portion) can be positioned between the first subset and the second subset of cooling channels to prevent or reduce "crosstalk" (e.g., heat transfer) between the cooling fluid circulated in the first subset of cooling channels and the cooling fluid circulated in the second subset of cooling channels. Similarly, a fluid gap can be created by isolating a first subset of one or more cooling channels which are adjacent to the first planar cooling surface from a second subset of one or more cooling channels which are adjacent to the second planar cooling surface, such as by a metal layer oriented parallel to the first planar cooling surface and the second planar cooling surface which separates the cooling fluid circulated through the first subset and second subset of cooling channels.

In some implementations, the cooling baseplate can include a plurality of pin fins positioned within the one or more cooling channels. For example, as the cooling fluid flows through the one or more cooling channels of the cooling baseplate, a plurality of pin fins can be positioned within the one or more cooling channels to aid in heat transfer from processor blades and/or coprocessor blades. For example, in some implementations, a plurality of pin fins can be positioned within the one or more cooling channels proximate to a processor blade or a coprocessor blade coupled to the cooling baseplate. In some implementations, the plurality of pin fins can be machined, milled, cast, or otherwise included in a bottom plate of a cooling baseplate such that the pin fins can extend from the bottom plate (e.g., first planar cooling surface) to a top plate (e.g., second planar cooling surface) within the one or more cooling channels. In some implementations, the plurality of pin fins can extend from either the first planar cooling surface or the second planar cooling surface into at least a subset of the one or more cooling channels. As the cooling fluid flows through the one or more cooling channels, the plurality of pin fins can be configured to transfer heat from a component mounted on a planar cooling surface to the cooling baseplate, and further to the cooling fluid flowing through the one or more cooling channels. For example, in some implementations, a plurality of computing devices be positioned on a cooling baseplate, and each respective computing device can include a plurality of pin fins configured to transfer heat from the respective processor blades and coprocessor blades to the cooling baseplate. In some implementations, the plurality of pin fins associated with a respective processor blade or coprocessor blade can be localized on the cooling baseplate, such as positioned directly above or below the respective processor blade or coprocessor blade in order to reduce the amount of pressure drop of the cooling fluid while still aiding in heat transfer from the respective processor blade or coprocessor blade.

In some implementations, the plurality of pin fins can include a plurality of diamond-shaped pin fins. For example, in some implementations, diamond-shaped pin fins can be milled into a bottom plate of a cooling baseplate and can be arranged in a grid-like pattern. For example, in some implementations, the diamond-shaped pin fins can have an angle of approximately 30 degrees on a leading edge of the pin fin to aid in diverting the cooling fluid flow around the diamond-shaped pin fins without overly impeding the flow of the cooling fluid or causing too large of a pressure drop. An advantage provided by diamond-shaped pin fins is that the pin fins can be readily milled into a bottom plate of a cooling baseplate.

In some implementations, the plurality of pin fins can include a plurality of rounded pin fins. For example, in some implementations, rounded pin fins can generally have a rounded shape (i.e., a circular or oval shape). For example, rather than having an angled leading edge such as on a diamond-shaped pin fin, the rounded pin fins can have a curved or rounded shape. An advantage provided by rounded pin fins is that as the cooling fluid flows around the rounded pin fins, a turbulence in the cooling fluid flow can be created, which can assist in additional heat transfer.

In some implementations, the cooling fluid can be a liquid cooling fluid. For example, in some implementations, a liquid coolant can be circulated to the inlet of the cooling baseplate from a cooling fluid source. In some implementations, the cooling fluid source can include a thermal interface configured to receive cooling from various cooling sources, such as air-condition coolant systems, integrated coolant loops (e.g., battery coolant loops, powered electronics coolant loops), radiator coolant loops, and/or other cooling sources. For example, the cooling source can be configured to cool a liquid coolant, circulate the cooled liquid coolant to the inlet of the cooling baseplate where the liquid coolant can absorb heat from the cooling baseplate (e.g., from the first and second planar cooling surfaces) via the one or more cooling channels, and receive the warmed liquid coolant via the outlet of the cooling baseplate. The cooling fluid source can then cool the liquid coolant further before recirculating the liquid coolant to the cooling baseplate.

In some implementations, the cooling baseplate can include a busbar configured to provide electric power to the one or more computing devices. For example, the busbar can be mounted on or adjacent to one of the planar cooling surfaces and can span a length of the cooling baseplate such that each computing device can connect to the busbar. In some implementations, one or more insulative grommets can be used to couple the busbar to the cooling baseplate.

In some implementations, the cooling baseplate can further be configured to act as a ground for the one or more computing devices. For example, a busbar can be configured to provide regulated power (e.g., 12V DC power) and can be electrically isolated from the cooling baseplate, such as by using insulative mounting components. Each processor blade and coprocessor blade can then include a ground, which can be coupled to the cooling baseplate. In this way, the cooling baseplate can act as a ground, which can help to reduce electromagnetic interference (EMI) and improve signal quality for the autonomous vehicle computing system. Moreover, this can help to reduce galvanic corrosion of the cooling baseplate, as the grounded cooling baseplate will not have any electric potential (e.g., positive or negative voltage).

In some implementations, the cooling baseplate can further include one or more ribs. For example, in each of the one or more ribs can be positioned on either the first planar cooling surface or the second planar cooling surface and can provide structural support for the autonomous vehicle computing system. For example, in some implementations, a rib can be positioned at each end of the cooling baseplate on each of the planar cooling surfaces, and a respective rib can be positioned between each computing device.

In some implementations, a housing can be mounted to the ribs. For example, one or more fasteners (e.g., clips, screws, spring-loaded screws, etc.) can secure the housing to the ribs. In some implementations, the housing can include a top cover secured over the first planar cooling surface, and a bottom cover secured over the second planar cooling surface. The ribs and the housing can together increase the structural integrity of the autonomous vehicle computing system.

According to additional aspects of the present disclosure, in some implementations, an autonomous vehicle computing system can include a first cooling baseplate and a second cooling baseplate. For example, the first cooling baseplate can include a first planar cooling surface, a first external housing oriented substantially parallel to the first planar cooling surface, an inlet configured to receive a cooling fluid, and an outlet. One or more cooling channels can be coupled between the inlet and the outlet and can be positioned between the first planar cooling surface and the first external housing. The one or more cooling channels can be configured to allow the cooling fluid to flow between the inlet and the outlet and provide cooling to the first planar cooling surface. Similarly, the second cooling baseplate can include a second planar cooling surface and a second external housing oriented substantially parallel to the second planar cooling surface. The second cooling baseplate can include an inlet configured to receive a cooling fluid and an outlet. One or more cooling channels can be coupled between the inlet and the outlet and can be positioned between the second planar cooling surface and the second external housing.

A cooling fluid connector can be coupled between the outlet of the first cooling baseplate and the inlet of the second cooling baseplate. The fluid connector can be configured to allow the cooling fluid to flow from the first outlet of the first cooling baseplate to the inlet of the second cooling baseplate. In some implementations, the cooling fluid connector can include a flexible hose. For example, the flexible hose can be coupled between the outlet of the first cooling baseplate and the inlet of the second cooling baseplate.

One or more computing devices can be included in the autonomous vehicle computing system. Each computing device can include a processor blade comprising a processor. The processor blade can be positioned on the first planar cooling surface in a surface-mounted orientation parallel to the first planar cooling surface. Similarly, one or more coprocessor blades each comprising at least one coprocessor can be positioned on the second planar cooling surface in a surface-mounted orientation parallel to the second planar cooling surface.

A flexible connector can be coupled between the processor blade and at least one of the one or more coprocessor blades. The flexible connector can be configured to transfer at least one of data or electric power between the processor blade and the at least one coprocessor blade, as described herein.

The first planar cooling surface can transfer heat from the processor blade to the cooling fluid via conduction and the second planar cooling surface can transfer heat from the one or more coprocessor blades to the cooling fluid via conduction.

In some implementations, a computing device may include a plurality of coprocessor blades. In such implementations, one or more additional flexible connectors can be coupled between the coprocessor blades, as described herein.

In some implementations, a hinge can couple the first cooling baseplate and the second cooling baseplate together. For example, the hinge can be configured to allow the first cooling baseplate and the second cooling baseplate to pivotably open such that the first external housing and the second external housing can lay flat in a common plane.

In some implementations, a fastener can be used to mechanically fasten the cooling baseplate and the second cooling baseplate together when the hinge is pivotably closed such that the first external housing and the second external housing are substantially oriented in two parallel planes. In this way, the autonomous vehicle computing system can be opened to allow for access to the computing devices contained therein or closed to provide a protective housing for the autonomous vehicle computing system, such as when the autonomous vehicle computing system is installed in an autonomous vehicle.

The systems and devices described herein may provide any number of technical effects and benefits. For example, the systems and devices according to example aspects of the present disclosure can allow for efficient heat removal from an autonomous vehicle computing system. For example, heat generated by one or more computing system components of an autonomous vehicle can be transferred to a cooling fluid (e.g., liquid coolant) in order to allow for the autonomous vehicle computing system to be operated safely, reliably, and within any applicable temperature constraints.

Further, by managing the operating temperature of an autonomous vehicle computing system, the likelihood of damage caused by overheating of computing system components can be reduced. Thus, the expected service life for individual components can be extended. Moreover, with sufficient thermal management, autonomous vehicle computing system components can be operated at increased performance settings, allowing for improved computational performance. Further, the systems and devices described herein can allow for the increased reliability of an autonomous vehicle computing system. By helping to ensure that the autonomous vehicle computing system operates reliably, passenger safety and convenience can be increased.

Additionally, the systems and devices according to example aspects of the present disclosure can provide increased flexibility in designing a computing system for an autonomous vehicle. For example, the systems and devices according to example aspects of the present disclosure can allow for individual computing system components to be upgraded, repaired, and/or replaced in an efficient and cost-effective manner. For example, should a computing system component need to be replaced, such as a coprocessor blade, the flexible connector(s) connecting the coprocessor blade to the processor blade and/or additional coprocessor blades can be uncoupled, the coprocessor blade can be replaced with a new coprocessor blade, and the flexible connectors can be connected to the new coprocessor blade. Further, as advances in computing system technology are made, individual processor blades, coprocessor blades, and/or components thereof (e.g., processors and/or coprocessors) can be replaced in the same manner. Thus, the systems and devices according to example aspects of the present disclosure allow for incremental upgrades and/or repairs to be made to an autonomous vehicle computing system without requiring the entire computing system and/or cooling system to be replaced.

With reference now to the FIGS., example aspects of the present disclosure will be discussed in further detail. FIG. 1 illustrates an example vehicle computing system 100 according to example aspects of the present disclosure. The vehicle computing system 100 can be associated with an autonomous vehicle 105. The vehicle computing system 100 can be located onboard (e.g., included on and/or within) the autonomous vehicle 105.

The autonomous vehicle 105 incorporating the vehicle computing system 100 can be various types of vehicles. For instance, the autonomous vehicle 105 can be a ground-based autonomous vehicle such as an autonomous car, autonomous truck, autonomous bus, autonomous bike, autonomous scooter, autonomous light electric vehicle (LEV), etc. The autonomous vehicle 105 can be an air-based autonomous vehicle (e.g., airplane, helicopter, or other aircraft) or other types of vehicles (e.g., watercraft, etc.). The autonomous vehicle 105 can drive, navigate, operate, etc. with minimal and/or no interaction from a human operator (e.g., driver). In some implementations, a human operator can be omitted from the autonomous vehicle 105 (and/or also omitted from remote control of the autonomous vehicle 105). In some implementations, a human operator can be included in the autonomous vehicle 105.

In some implementations, the autonomous vehicle 105 can be configured to operate in a plurality of operating modes. The autonomous vehicle 105 can be configured to operate in a fully autonomous (e.g., self-driving) operating mode in which the autonomous vehicle 105 is controllable without user input (e.g., can drive and navigate with no input from a human operator present in the autonomous vehicle 105 and/or remote from the autonomous vehicle 105). The autonomous vehicle 105 can operate in a semi-autonomous operating mode in which the autonomous vehicle 105 can operate with some input from a human operator present in the autonomous vehicle 105 (and/or a human operator that is remote from the autonomous vehicle 105). The autonomous vehicle 105 can enter into a manual operating mode in which the autonomous vehicle 105 is fully controllable by a human operator (e.g., human driver, pilot, etc.) and can be prohibited and/or disabled (e.g., temporary, permanently, etc.) from performing autonomous navigation (e.g., autonomous driving). In some implementations, the autonomous vehicle 105 can implement vehicle operating assistance technology (e.g., collision mitigation system, power assist steering, etc.) while in the manual operating mode to help assist the human operator of the autonomous vehicle 105.

The operating modes of the autonomous vehicle 105 can be stored in a memory onboard the autonomous vehicle 105. For example, the operating modes can be defined by an operating mode data structure (e.g., rule, list, table, etc.) that indicates one or more operating parameters for the autonomous vehicle 105, while in the particular operating mode. For example, an operating mode data structure can indicate that the autonomous vehicle 105 is to autonomously plan its motion when in the fully autonomous operating mode. The vehicle computing system 100 can access the memory when implementing an operating mode.

The operating mode of the autonomous vehicle 105 can be adjusted in a variety of manners. For example, the operating mode of the autonomous vehicle 105 can be selected remotely, off-board the autonomous vehicle 105. For example, a remote computing system (e.g., of a vehicle provider and/or service entity associated with the autonomous vehicle 105) can communicate data to the autonomous vehicle 105 instructing the autonomous vehicle 105 to enter into, exit from, maintain, etc. an operating mode. By way of example, such data can instruct the autonomous vehicle 105 to enter into the fully autonomous operating mode. In some implementations, the operating mode of the autonomous vehicle 105 can be set onboard and/or near the autonomous vehicle 105. For example, the vehicle computing system 100 can automatically determine when and where the autonomous vehicle 105 is to enter, change, maintain, etc. a particular operating mode (e.g., without user input). Additionally, or alternatively, the operating mode of the autonomous vehicle 105 can be manually selected via one or more interfaces located onboard the autonomous vehicle 105 (e.g., key switch, button, etc.) and/or associated with a computing device proximate to the autonomous vehicle 105 (e.g., a tablet operated by authorized personnel located near the autonomous vehicle 105). In some implementations, the operating mode of the autonomous vehicle 105 can be adjusted by manipulating a series of interfaces in a particular order to cause the autonomous vehicle 105 to enter into a particular operating mode.

The vehicle computing system 100 can include one or more computing devices located onboard the autonomous vehicle 105. For example, the computing device(s) can be located on and/or within the autonomous vehicle 105. The computing device(s) can include various components for performing various operations and functions. For instance, the computing device(s) can include one or more processors and one or more tangible, non-transitory, computer readable media (e.g., memory devices, etc.). The one or more tangible, non-transitory, computer readable media can store instructions that when executed by the one or more processors cause the autonomous vehicle 105 (e.g., its computing system, one or more processors, etc.) to perform operations and functions, such as those described herein for determining sensor degradation conditions and implementing sensor corrective actions, etc.

The autonomous vehicle 105 can include a communications system 120 configured to allow the vehicle computing system 100 (and its computing device(s)) to communicate with other computing devices. The vehicle computing system 100 can use the communications system 120 to communicate with one or more computing device(s) that are remote from the autonomous vehicle 105 over one or more networks (e.g., via one or more wireless signal connections). For example, the communications system 120 can allow the autonomous vehicle to communicate and receive data from an operations computing system 199 of a service entity. In some implementations, the communications system 120 can allow communication among one or more of the system(s) on-board the autonomous vehicle 105. The communications system 120 can include any suitable components for interfacing with one or more network(s), including, for example, transmitters, receivers, ports, controllers, antennas, and/or other suitable components that can help facilitate communication.

As shown in FIG. 1, the autonomous vehicle 105 can include one or more vehicle sensors 125, an autonomy computing system 130, one or more vehicle control systems 135, and other systems, as described herein. One or more of these systems can be configured to communicate with one another via a communication channel. The communication channel can include one or more data buses (e.g., controller area network (CAN)), on-board diagnostics connector (e.g., OBD-II), and/or a combination of wired and/or wireless communication links. The onboard systems can send and/or receive data, messages, signals, etc. amongst one another via the communication channel.

The vehicle sensor(s) 125 can be configured to acquire sensor data 140. This can include sensor data associated with the surrounding environment of the autonomous vehicle 105. For instance, the sensor data 140 can acquire image and/or other data within a field of view of one or more of the vehicle sensor(s) 125. The vehicle sensor(s) 125 can include a Light Detection and Ranging (LIDAR) system, a Radio Detection and Ranging (RADAR) system, one or more cameras (e.g., visible spectrum cameras, infrared cameras, etc.), ultrasonic sensors, wheel encoders, steering angle encoders, positioning sensors (e.g., GPS sensors), inertial measurement units, motion sensors, and/or other types of image capturing devices and/or sensors. The sensor data 140 can include image data, RADAR data, LIDAR data, and/or other data acquired by the vehicle sensor(s) 125. The autonomous vehicle 105 can include other sensors configured to acquire data associated with the autonomous vehicle 105. For example, the autonomous vehicle 105 can include inertial measurement unit(s) and/or other sensors.

In some implementations, the sensor data 140 can be indicative of one or more objects within the surrounding environment of the autonomous vehicle 105. The object(s) can include, for example, vehicles, pedestrians, bicycles, and/or other objects. The object(s) can be located in front of, to the rear of, to the side of the autonomous vehicle 105, etc. The sensor data 140 can be indicative of locations associated with the object(s) within the surrounding environment of the autonomous vehicle 105 at one or more times. The vehicle sensor(s) 125 can communicate (e.g., transmit, send, make available, etc.) the sensor data 140 to the autonomy computing system 130.

In addition to the sensor data 140, the autonomy computing system 130 can retrieve or otherwise obtain map data 145. The map data 145 can provide information about the surrounding environment of the autonomous vehicle 105. In some implementations, an autonomous vehicle 105 can obtain detailed map data that provides information regarding: the identity and location of different roadways, road segments, buildings, or other items or objects (e.g., lampposts, crosswalks, curbing, etc.); the location and directions of traffic lanes (e.g., the location and direction of a parking lane, a turning lane, a bicycle lane, or other lanes within a particular roadway or other travel way and/or one or more boundary markings associated therewith); traffic control data (e.g., the location and instructions of signage, traffic lights, or other traffic control devices); the location of obstructions (e.g., roadwork, accidents, etc.); data indicative of events (e.g., scheduled concerts, parades, etc.); and/or any other map data that provides information that assists the autonomous vehicle 105 in comprehending and perceiving its surrounding environment and its relationship thereto. In some implementations, the vehicle computing system 100 can determine a vehicle route for the autonomous vehicle 105 based at least in part on the map data 145.

The autonomous vehicle 105 can include a positioning system 150. The positioning system 150 can determine a current position of the autonomous vehicle 105. The positioning system 150 can be any device or circuitry for analyzing the position of the autonomous vehicle 105. For example, the positioning system 150 can determine position by using one or more of inertial sensors (e.g., inertial measurement unit(s), etc.), a satellite positioning system, based on IP address, by using triangulation and/or proximity to network access points or other network components (e.g., cellular towers, WiFi access points, etc.) and/or other suitable techniques. The position of the autonomous vehicle 105 can be used by various systems of the vehicle computing system 100 and/or provided to a remote computing system. For example, the map data 145 can provide the autonomous vehicle 105 relative positions of the elements of a surrounding environment of the autonomous vehicle 105. The autonomous vehicle 105 can identify its position within the surrounding environment (e.g., across six axes, etc.) based at least in part on the map data 145. For example, the vehicle computing system 100 can process the sensor data 140 (e.g., LIDAR data, camera data, etc.) to match it to a map of the surrounding environment to get an understanding of the vehicle's position within that environment.

The autonomy computing system 130 can include a perception system 155, a prediction system 160, a motion planning system 165, and/or other systems that cooperate to perceive the surrounding environment of the autonomous vehicle 105 and determine a motion plan 180 for controlling the motion of the autonomous vehicle 105 accordingly. For example, the autonomy computing system 130 can obtain the sensor data 140 from the vehicle sensor(s) 125, process the sensor data 140 (and/or other data) to perceive its surrounding environment, predict the motion of objects within the surrounding environment, and generate an appropriate motion plan 180 through such surrounding environment. The autonomy computing system 130 can communicate with the one or more vehicle control systems 135 to operate the autonomous vehicle 105 according to the motion plan 180.

The vehicle computing system 100 (e.g., the autonomy computing system 130) can identify one or more objects that are proximate to the autonomous vehicle 105 based at least in part on the sensor data 140 and/or the map data 145. For example, the vehicle computing system 100 (e.g., the perception system 155) can process the sensor data 140, the map data 145, etc. to obtain perception data 170. The vehicle computing system 100 can generate perception data 170 that is indicative of one or more states (e.g., current and/or past state(s)) of a plurality of objects that are within a surrounding environment of the autonomous vehicle 105. For example, the perception data 170 for each object can describe (e.g., for a given time, time period) an estimate of the object's: current and/or past location (also referred to as position); current and/or past speed/velocity; current and/or past acceleration; current and/or past heading; current and/or past orientation; a shape; a size/footprint (e.g., as represented by a bounding shape); a type/class (e.g., pedestrian class vs. vehicle class vs. bicycle class), a distance from the autonomous vehicle 105; the uncertainties associated therewith, and/or other state information. The perception system 155 can provide the perception data 170 to the prediction system 160, and/or the motion planning system 165.

The prediction system 160 can be configured to predict a motion of the object(s) within the surrounding environment of the autonomous vehicle 105. For instance, the prediction system 160 can generate prediction data 175 associated with such object(s). The prediction data 175 can be indicative of one or more predicted future locations of each respective object. For example, the prediction system 160 can determine a predicted motion trajectory along which a respective object is predicted to travel over time. A predicted motion trajectory can be indicative of a path that the object is predicted to traverse and an associated timing with which the object is predicted to travel along the path. The predicted path can include and/or be made up of a plurality of way points. In some implementations, the prediction data 175 can be indicative of the speed and/or acceleration at which the respective object is predicted to travel along its associated predicted motion trajectory. The prediction system 160 can output the prediction data 175 (e.g., indicative of one or more of the predicted motion trajectories) to the motion planning system 165.

The vehicle computing system 100 (e.g., the motion planning system 165) can determine a motion plan 180 for the autonomous vehicle 105 based at least in part on the perception data 170, the prediction data 175, and/or other data. A motion plan 180 can include vehicle actions (e.g., planned vehicle trajectories, speed(s), acceleration(s), other actions, etc.) with respect to one or more of the objects within the surrounding environment of the autonomous vehicle 105 as well as the objects' predicted movements. For instance, the motion planning system 165 can implement an optimization algorithm, model, etc. that considers cost data associated with a vehicle action as well as other objective functions (e.g., cost functions based on speed limits, traffic lights, etc.), if any, to determine optimized variables that make up the motion plan 180. The motion planning system 165 can determine that the autonomous vehicle 105 can perform a certain action (e.g., pass an object, etc.) without increasing the potential risk to the autonomous vehicle 105 and/or violating any traffic laws (e.g., speed limits, lane boundaries, signage, etc.). For instance, the motion planning system 165 can evaluate one or more of the predicted motion trajectories of one or more objects during its cost data analysis as it determines an optimized vehicle trajectory through the surrounding environment. The motion planning system 165 can generate cost data associated with such trajectories. In some implementations, one or more of the predicted motion trajectories may not ultimately change the motion of the autonomous vehicle 105 (e.g., due to an overriding factor). In some implementations, the motion plan 180 may define the vehicle's motion such that the autonomous vehicle 105 avoids the object(s), reduces speed to give more leeway to one or more of the object(s), proceeds cautiously, performs a stopping action, etc.

The motion planning system 165 can be configured to continuously update the vehicle's motion plan 180 and a corresponding planned vehicle motion trajectory. For example, in some implementations, the motion planning system 165 can generate new motion plan(s) 180 for the autonomous vehicle 105 (e.g., multiple times per second). Each new motion plan 180 can describe a motion of the autonomous vehicle 105 over the next planning period (e.g., next several seconds). Moreover, a new motion plan 180 may include a new planned vehicle motion trajectory. Thus, in some implementations, the motion planning system 165 can continuously operate to revise or otherwise generate a short-term motion plan based on the currently available data. Once the optimization planner has identified the optimal motion plan 180 (or some other iterative break occurs), the optimal motion plan 180 (and the planned motion trajectory) can be selected and executed by the autonomous vehicle 105.

The vehicle computing system 100 can cause the autonomous vehicle 105 to initiate a motion control in accordance with at least a portion of the motion plan 180. A motion control can be an operation, action, etc. that is associated with controlling the motion of the vehicle. For instance, the motion plan 180 can be provided to the vehicle control system(s) 135 of the autonomous vehicle 105. The vehicle control system(s) 135 can be associated with a vehicle controller (e.g., including a vehicle interface) that is configured to implement the motion plan 180. The vehicle controller can, for example, translate the motion plan 180 into instructions for the appropriate vehicle control component (e.g., acceleration control, brake control, steering control, etc.). By way of example, the vehicle controller can translate a determined motion plan 180 into instructions to adjust the steering of the autonomous vehicle 105 "X" degrees, apply a certain magnitude of braking force, etc. The vehicle controller (e.g., the vehicle interface) can help facilitate the responsible vehicle control (e.g., braking control system, steering control system, acceleration control system, etc.) to execute the instructions and implement the motion plan 180 (e.g., by sending control signal(s), making the translated plan available, etc.). This can allow the autonomous vehicle 105 to autonomously travel within the vehicle's surrounding environment.

The autonomous vehicle 105 can include an HMI ("Human Machine Interface") 190 that can output data for and accept input from a user 195 of the autonomous vehicle 105. The HMI 190 can include one or more output devices such as display devices, speakers, tactile devices, etc. For instance, the autonomous vehicle 105 can include a plurality of display devices. The display devices can include smart glass technology, a display screen, CRT, LCD, plasma screen, touch screen, TV, projector, other types of display devices and/or a combination thereof. One or more of the display devices can be included in a user device (e.g., personal computer, tablet, mobile phone, etc.).

The plurality of display devices can include a first display device and a second display device. The first display device can be associated with the exterior of the autonomous vehicle 105. The first display device can be located on an exterior surface and/or other structure, of the autonomous vehicle 105 and/or configured such that a user 195 can view and/or interact with the first display device (and/or a user interface rendered thereon) from the exterior of the autonomous vehicle 105. For example, one or more windows of the autonomous vehicle 105 can include smart glass technology that can perform as the first display device. The second display device can be associated with the interior of the autonomous vehicle 105. The second display device can be located on an interior surface and/or other structure (e.g., seat, etc.) of the autonomous vehicle 105 and/or configured such that a user can view and/or interact with the second display device (and/or a user interface rendered thereon) from the interior of the autonomous vehicle 105. For example, a user device (e.g., tablet, etc.) located within the interior of the autonomous vehicle 105 can include the second display device.

The autonomous vehicle 105 can be associated with a variety of different parties. In some implementations, the autonomous vehicle 105 can be associated with a vehicle provider. The vehicle provider can include, for example, an owner, a manufacturer, a vendor, a manager, a coordinator, a handler, etc. of the autonomous vehicle 105. The vehicle provider can be an individual, a group of individuals, an entity (e.g., a company), a group of entities, a service entity, etc. In some implementations, the autonomous vehicle 105 can be included in a fleet of vehicles associated with the vehicle provider. The vehicle provider can utilize a vehicle provider computing system that is remote from the autonomous vehicle 105 to communicate (e.g., over one or more wireless communication channels) with the vehicle computing system 100 of the autonomous vehicle 105. The vehicle provider computing system can include a server system (e.g., of an entity), a user device (e.g., of an individual owner), and/or other types of computing systems.

The autonomous vehicle 105 can be configured to perform vehicle services for one or more service entities. An autonomous vehicle 105 can perform a vehicle service by, for example, travelling (e.g., traveling autonomously) to a location associated with a requested vehicle service, allowing user(s) 195 and/or item(s) to board or otherwise enter the autonomous vehicle 105, transporting the user(s) 195 and/or item(s), allowing the user(s) 195 and/or item(s) to deboard or otherwise exit the autonomous vehicle 105, etc. In this way, the autonomous vehicle 105 can provide the vehicle service(s) for a service entity to a user 195.

A service entity can be associated with the provision of one or more vehicle services. For example, a service entity can be an individual, a group of individuals, a company (e.g., a business entity, organization, etc.), a group of entities (e.g., affiliated companies), and/or another type of entity that offers and/or coordinates the provision of one or more vehicle services to one or more users 195. For example, a service entity can offer vehicle service(s) to users 195 via one or more software applications (e.g., that are downloaded onto a user computing device), via a website, and/or via other types of interfaces that allow a user 195 to request a vehicle service. As described herein, the vehicle services can include transportation services (e.g., by which a vehicle transports user(s) 195 from one location to another), delivery services (e.g., by which a vehicle transports/delivers item(s) to a requested destination location), courier services (e.g., by which a vehicle retrieves item(s) from a requested origin location and transports/delivers the item to a requested destination location), and/or other types of services.

Each service entity can be associated with a respective telecommunications network system of that service entity. A telecommunications network system can include the infrastructure to facilitate communication between the autonomous vehicle 105 and the various computing systems of the associated service entity that are remote from the autonomous vehicle 105. For example, a service entity can utilize an operations computing system 199 to communicate with, coordinate, manage, etc. autonomous vehicle(s) to perform the vehicle services of the service entity. A telecommunications network system can allow an autonomous vehicle 105 to utilize the back-end functionality of the respective operations computing system 199 (e.g., service assignment allocation, vehicle technical support, etc.).

An operations computing system 199 can include one or more computing devices that are remote from the autonomous vehicle 105 (e.g., located off-board the autonomous vehicle 105). For example, such computing device(s) can be components of a cloud-based server system and/or other type of computing system that can communicate with the vehicle computing system 100 of the autonomous vehicle 105, another computing system (e.g., a vehicle provider computing system, etc.), a user device, etc. The operations computing system 199 can be or otherwise included in a data center for the service entity, for example. The operations computing system can be distributed across one or more location(s) and include one or more sub-systems. The computing device(s) of an operations computing system 199 can include various components for performing various operations and functions. For instance, the computing device(s) can include one or more processor(s) and one or more tangible, non-transitory, computer readable media (e.g., memory devices, etc.). The one or more tangible, non-transitory, computer readable media can store instructions that when executed by the one or more processor(s) cause the operations computing system (e.g., the one or more processors, etc.) to perform operations and functions, such as communicating data to and/or obtaining data from vehicle(s), etc.

In some implementations, the operations computing system 199 and the vehicle computing system 100 can indirectly communicate. For example, a vehicle provider computing system can serve as an intermediary between the operations computing system and the vehicle computing system 100 such that at least some data is communicated from the operations computing system 199 (or the vehicle computing system 100) to the vehicle provider computing system and then to the vehicle computing system 100 (or the operations computing system 199).

The vehicle 105 can also include a cooling system 185. The cooling system 185 and/or components of the cooling system 185 can be integrated into or otherwise a part of the vehicle computing system 185. Example cooling systems, computing systems, and components thereof are discussed in greater detail with respect to FIGS. 2-11.

Figure 2:
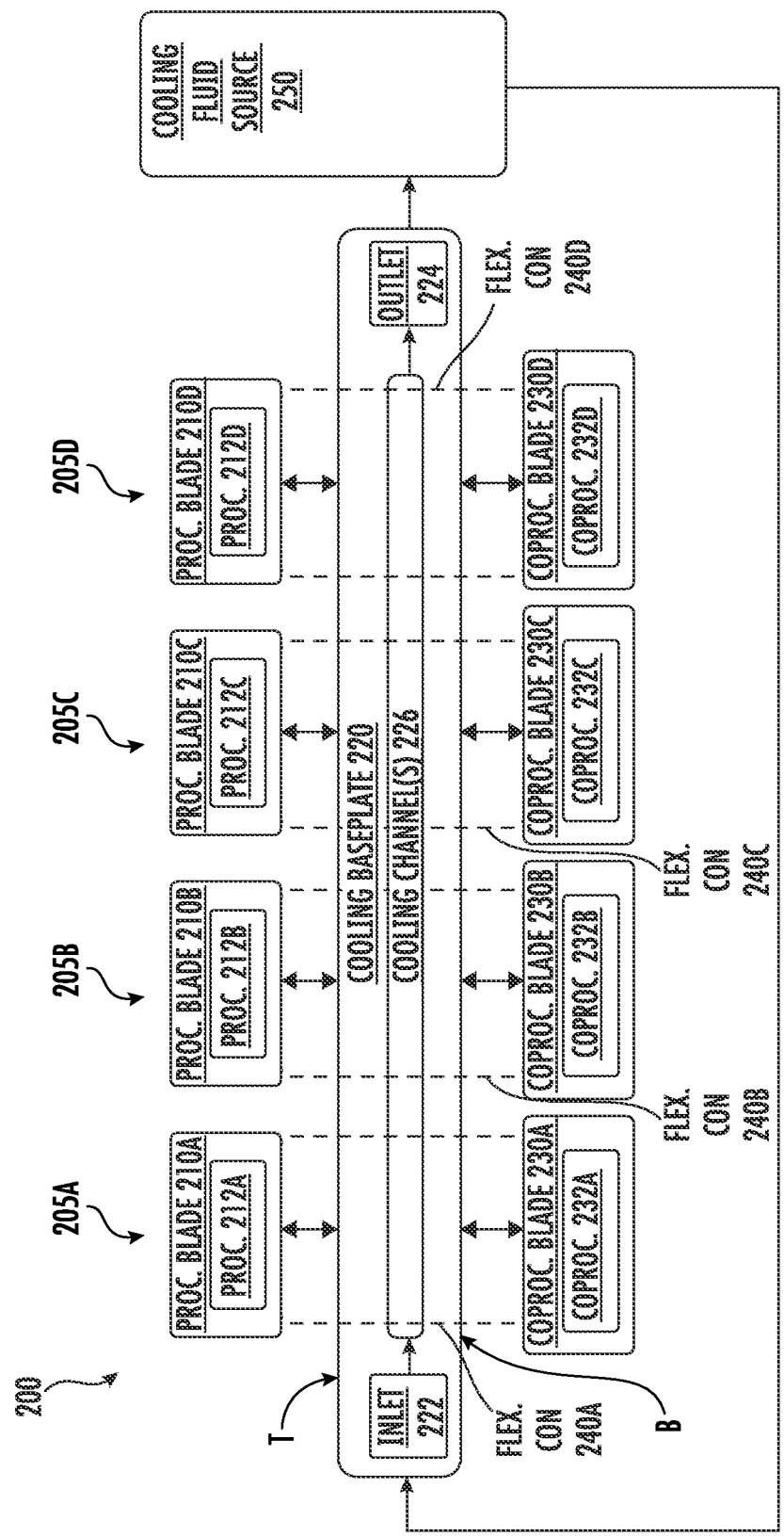
FIG. 2 depicts a block diagram of an example cooled autonomous vehicle computing system according to example aspects of the present disclosure.

For example, referring now to FIG. 2, an example computing system 200 according to example aspects of the present disclosure is depicted. A computing system 200 can include a cooling baseplate 220, one or more computing devices 205, and a cooling fluid source 250. The one or more computing devices 205 can be, for example, one or more computing devices in a vehicle computing system 105 depicted in FIG. 1.

The cooling baseplate 220 can be configured to provide cooling to the one or more computing devices 205. For example, the cooling baseplate 220 can include an inlet 222 configured to receive a cooling fluid and an outlet 224. One or more cooling channels 226 can be coupled between the inlet 222 and the outlet 224 of the cooling baseplate 220. The one or more cooling channels 226 can be configured to allow the cooling fluid to flow between the inlet 222 and the outlet 224 to absorb heat transferred to the cooling baseplate 220.

For example, in some implementations, the cooling fluid source 250 can be a liquid cooling fluid source. For example, in some implementations, the cooling fluid source 250 can include a thermal interface configured to receive cooling from various cooling sources, such as air-condition coolant systems, integrated coolant loops (e.g., battery coolant loops, powered electronics coolant loops), radiator coolant loops, or other cooling sources (not shown). The cooling fluid source 250 can be configured to cool a liquid coolant, circulate the cooled liquid coolant to the inlet 222 of the cooling baseplate 220 where the liquid coolant can absorb heat from the cooling baseplate 220 via the one or more cooling channels 226, and receive the warmed liquid coolant via the outlet 224 of the cooling baseplate 220. The liquid coolant can then be recirculated to the cooling fluid source 250, which can then cool the liquid coolant before recirculating the liquid coolant to the cooling baseplate 220 for additional cooling.

In some implementations, the cooling fluid can be a gaseous fluid, such as air circulated through one or more cooling channels 226 of a cooling baseplate 220 to provide cooling to one or more components of the vehicle computing system. In some implementations, the cooling fluid can be a phase change fluid, such as a refrigerant coolant which changes from a liquid to a gas as it expands and absorbs heat as it expands. In a phase change fluid implementation, the cooling fluid source 250 can compress the gas to a liquid, which can then be recirculated to the cooling baseplate 220.

The cooling baseplate 220 can include a first planar cooling surface T and a second planar cooling surface B. The first planar cooling surface T can correspond to, for example, a "top" portion of the cooling baseplate 220 and the second planar cooling surface B can correspond to, for example, a "bottom" portion of the cooling baseplate 220. While in FIG. 2 the first planar cooling surface is depicted as corresponding to the "top" portion of the cooling baseplate 220 and the second planar cooling surface is depicted as corresponding to the "bottom" portion of the cooling baseplate 220, either the "top" or "bottom" portion can correspond to the first planar cooling surface or the second planar cooling surface. The terms "top" and "bottom" are used herein to refer to and differentiate between planar cooling surfaces and are not meant to be limiting to a specific orientation or position of the cooling baseplate 220. For example, in some implementations, the cooling baseplate 220 can be oriented in a vertical orientation and a "top" or a "bottom" planar cooling surface can correspond to a "right" or a "left" planar cooling surface, depending on the orientation of the observer.

As shown, the second planar cooling surface B can be oriented substantially parallel to the first planar cooling surface T. As the cooling fluid flows from the inlet 222 through the cooling channels 226 to the outlet 224, the cooling fluid can provide cooling to the first planar cooling surface T and the second planar cooling surface B. The planar cooling surfaces T and B need not be perfectly flat, but can include various indentations (e.g., sockets), mounting components, and/or other surface height variations to allow for the processor blades 210 and/or coprocessor blades 230 to be coupled to the cooling baseplate 220.

According to example aspects of the present disclosure, each of the one or more computing devices 205 can include a processor blade 210 and a coprocessor carrier comprising one or more coprocessor blades 230. For example, as depicted in FIG. 2, four computing devices 205A-D are shown, with each computing device 205A-D comprising a respective processor blade 210A-D, a coprocessor carrier comprising one or more coprocessor blades 230A-D, and flexible connector 240A-D.

Each processor blade 210 can include one or more processors 212. In some implementations, a processor blade 210 can include a plurality of processors 212. For example, a processor 212 can be a central processing unit (CPU) for the computing device. In some implementations, each processor blade 210 can include a printed circuit board (PCB), such as a motherboard, and the processor 212 can be coupled to the processor blade 210. Other computing components can also be incorporated into the processor blade 210, such as data storage (e.g., solid state drives (SSDs)), memory modules (e.g., RAM, ROM, SDRAM, DDRAM, etc.), and/or other computing components.

Each processor blade 210 can be positioned in a surface-mounted orientation parallel to the first planar cooling surface T. For example, in some implementations, a processor blade 210 can be mounted on the first planar cooling surface T using one or more fasteners (e.g., clips, screws, spring-loaded screws, etc.). In some implementations, a load spreader can be used to mount the processor blade 210 to the first planar cooling surface T which can assist in reducing stress on mounting locations of the processor blade 210.

In some implementations, the processor blade 210 can be mounted to the first planar cooling surface such that the processor 212 of the processor blade 210 can be in direct contact with the first planar cooling surface T (e.g., physically touching) to allow for heat to be transferred to the first planar cooling surface T via conduction. In some implementations, a thermally conductive compound (e.g., a thermal paste) can be applied between the processor 212 and the first planar cooling surface T to aid in the heat transfer.

The coprocessor carrier can include one or more coprocessor blades 230 for each computing device 205. For example, in some implementations, a coprocessor carrier can include a single coprocessor blade 230. In some implementations, a coprocessor carrier can include a plurality of coprocessor blades 230.

Each coprocessor blade 230 can be positioned in a surface-mounted orientation parallel to the second planar cooling surface B. For example, in some implementations, a coprocessor blade 230 can be mounted on the second planar cooling surface B using one or more fasteners (e.g., clips, screws, spring-loaded screws, etc.). In some implementations, a load spreader can be used to mount the coprocessor blade 230 to the second planar cooling surface B which can assist in reducing stress on mounting locations of the coprocessor blade 230.

In some implementations, the coprocessor blade 230 can be mounted to the second planar cooling surface such that the coprocessor 232 of the coprocessor blade 230 can be in direct contact with the second planar cooling surface B (e.g., physically touching) to allow for heat to be transferred to the second planar cooling surface B via conduction. In some implementations, a thermally conductive compound (e.g., a thermal paste) can be applied between the coprocessor 232 and the second planar cooling surface B to aid in the heat transfer. In some implementations, a heat spreader can be positioned between the coprocessor 232 and the second planar cooling surface B. For example, a heat spreader can be a block of material with a high thermal conductivity, such as copper and/or aluminum, a vapor chamber, and/or any other heat spreader.

The coprocessor(s) 232 can be, for example, graphics processing units (GPUs), application specific integrated circuits (ASICs), and/or field programmable gate arrays (FPGAs). Each coprocessor 232 (e.g., FPGA, ASIC, GPU) can be used to supplement the functions of the associated processor(s) 212 (e.g., CPU(s)) by, for example, performing intensive calculations. For example, one example supplemental function a GPU can perform is image analysis. Similarly, ASICs and/or FPGAs can be configured to perform specific computational algorithms, such as motion prediction and/or other computational algorithms. The coprocessor(s) 232 (e.g., FPGAs, ASICs, and/or GPUs) can be used to perform any suitable supplemental processing function for the one or more processors 212.

In some implementations, a plurality of coprocessors 232 can each supplement a single processor 212. For example, in some implementations, two GPUs and a FPGA can each be configured to supplement a processor 212. In some implementations, each of the coprocessors 232 for a single computing device 205 can be mounted on a respective coprocessor blade 230, while in others, a plurality of coprocessors 232 can be mounted on a single coprocessor blade 230. In some implementations, a plurality of coprocessor blades 230 can each supplement a single processor 212. For example, in some implementations, a plurality of coprocessor blades 230 hosting at least one coprocessor 232 (e.g., FPGA, GPU) could connect to a single processor blade 210 hosting at least one processor 212 (e.g., CPU).

According to example aspects of the present disclosure, a processor blade 210 and a coprocessor carrier comprising one or more coprocessor blades 230 can be coupled by a flexible connector 240. For example, as shown in FIG. 2, each processor blade 210A-D is coupled to at least one coprocessor blade 230A-D by a respective flexible connector 240A-D (depicted in dashed lines). The flexible connector 240 can be configured to transfer at least one of data or electric power between the processor blade 210 and the at least one coprocessor blade 230.

For example, the flexible connector 240 can be a flexible circuit board. In some implementations, the flexible connector 240 can include a layer of polyimide film (e.g., Kapton) which can be coated with a plurality of copper strands and an insulative sealant. For example, the layer of polyimide film can be approximately 1.0 to 6.0 mils (e.g., thousandths of an inch) thick. In some implementations, each of the plurality of copper strands can be approximately 0.2 to 2.0 mils thick. The copper strands can be, for example, individual copper strands corresponding to individual pins of a connector. In some implementations, the individual copper strands can be used for data transfer. In some implementations, a wide layer of copper can be used for electric power transfer. In some implementations, the wide layer of copper can be correspond to a plurality of power pins in a connector. The insulative sealant can be applied on top of the copper strands in order to insulate the copper strands. Stated differently, the copper strands can be positioned (e.g., sealed) between the polyimide film and the insulative sealant.

In some implementations, a subset of copper strands can be positioned on a first side of the polyimide film, and a second subset of copper strands can be positioned on a second side of the polyimide film. Each subset can be coated with an insulative sealant and/or additional layers of polyimide film. In this way, a flexible connector can be a two-sided flexible connector. Similarly, a flexible connector can include a plurality of alternating film and copper layers (e.g., three layers of copper and two layers of film).

In some implementations, the flexible connector(s) 240 can include connectors at one or more ends of the flexible connector 240. For example, in some implementations, a connector of a flexible connector 240 can plug into a corresponding portion of a processor blade 210 and/or coprocessor blade 230.

In some implementations, the flexible connector(s) 240 can be incorporated into a coprocessor carrier. For example, a flexible connector 240 can be layered into one or more processor blades 230 (e.g. sandwiched between a plurality of PCB layers and/or layered adjacent to a PCB layer of a processor blade 230). Individual strands of the flexible connector 240 can then be coupled to corresponding components (e.g., coprocessor 232 pins) by, for example solder, brazing, VIAs, etc.

The relatively thin layer of polyimide film, layer(s) of copper strands, and layer(s) of insulative sealant can allow for the flexible connector 240 to bend (e.g., flex). For example, the flexible connector can plug into a connector on the processor blade 210 and wrap around the cooling baseplate to plug into a connector on one of the coprocessor blades 230. This can allow for the flexible connector 240 to transfer data and/or electric power between the processor blade 210 and the coprocessor blade 230.

In some implementations, a plurality of coprocessor blades 230 can be included in a single computing device 205, and additional flexible connector(s) can be coupled between coprocessor blades 230.

Figure 3:
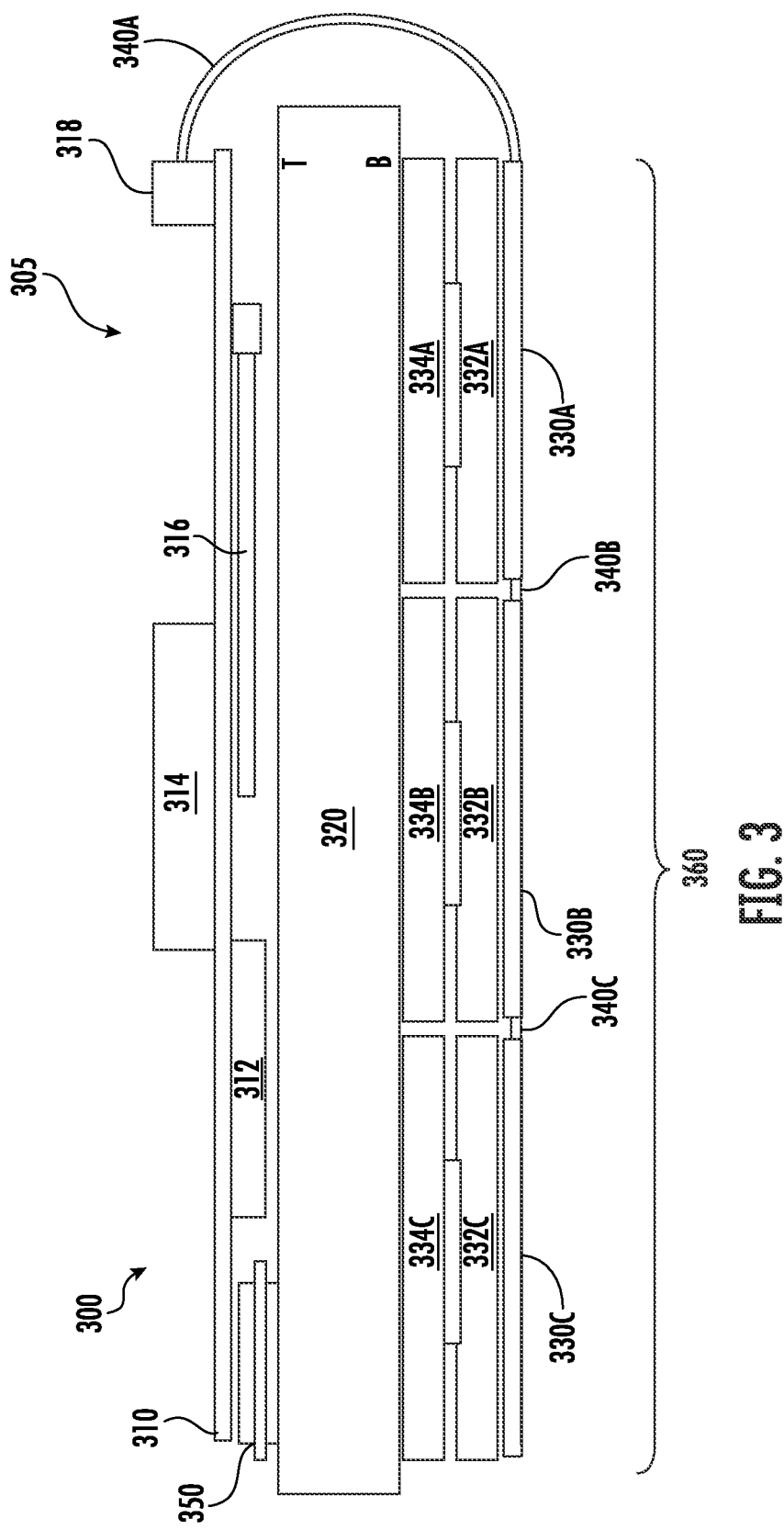
FIG. 3 depicts a side view of an example autonomous vehicle computing system according to example aspects of the present disclosure.

For example, referring now to FIG. 3, a side view of a computing system 300 is depicted. The computing system 300 can correspond to, for example, the vehicle computing system 105 and computing system 200 depicted in FIGS. 1 and 2. A computing device 305 can be mounted to two parallel sides of a cooling baseplate 320.

For example, as shown, a processor blade 310 is positioned on a first planar cooling surface T and three coprocessor blades 330A-C of a coprocessor carrier 360 are positioned on a second planar cooling surface B of a cooling baseplate 320. As noted with respect to FIG. 2, the first planar cooling surface can correspond to either a top or bottom of the cooling baseplate 320, with the second planar cooling surface corresponding to the opposite side. Further, as depicted, a processor 312 of the coprocessor blade 310 is positioned on the first planar cooling surface T. The processor blade 310 can include additional components, such as a storage device (e.g., an SSD) 316, and a memory module 314.

A first flexible connector 340A connects the processor blade 310 to a first coprocessor blade 330A. For example, the flexible connector 340A can plug into a connector 318 on the processor blade 310. Similar connectors (not shown) can be included on the coprocessor blades 330A-C and/or a flexible connector 340 can be incorporated into one or more coprocessor blades 330 of the coprocessor carrier 360, as described herein. A second flexible connector 340B can connect the first coprocessor blade 330A to the second coprocessor blade 330B, and a third flexible connector 340C can connect the second coprocessor blade 330B to the third coprocessor blade 330C. Each of the coprocessor blades 330A-C can include a respective coprocessor 332A-C, which can be coupled to a respective heat spreader 334A-C.

According to additional aspects of the present disclosure, a busbar 350 can be configured to provide electric power to the computing device 305. As depicted, the busbar 350 is mounted on the first planar cooling surface T. However, in other implementations, the busbar 350 can be mounted on or adjacent to the cooling baseplate 320, including on the second planar cooling surface B and/or on either of the end portions of the cooling baseplate 320. In some implementations, the busbar 350 can span a length of the cooling baseplate 320 such that each computing device 305 (e.g., a component thereof) can connect to the busbar 350. In some implementations, one or more insulative grommets can be used to couple the busbar to the cooling baseplate 320.

As shown, the processor blade 310 is coupled to the busbar 350, thereby allowing for electric power to be provided to the processor blade 310. Electric power can be provided from the processor blade 310 to each of the coprocessor blades 330A-C via the respective flexible connectors 340A-C in a daisy-chain configuration. In an implementation in which the busbar 350 is positioned on the second planar cooling surface B, one of the coprocessor blades 330A-C can be coupled to the busbar 350, and the flexible connectors 340A-C can transfer electric power from the powered coprocessor blade 330 to the other the coprocessor blade(s) 330 and the processor blade 310.

In some implementations, the cooling baseplate can further be configured to act as a ground for the computing device(s) 305. For example, the busbar 350 can be configured to provide regulated power (e.g., 12V DC power) and can be electrically isolated from the cooling baseplate 320, such as by using insulative mounting components (e.g., rubber grommets). Each processor blade 310 and coprocessor blade 330 can then include a ground, which can be coupled to the cooling baseplate 320. In this way, the cooling baseplate 320 can act as a ground, which can help to reduce electromagnetic interference (EMI) and improve signal quality for the computing system. Moreover, this can help to reduce galvanic corrosion of the cooling baseplate 320, as the grounded cooling baseplate 320 will not have any electric potential (e.g., positive or negative voltage).

Figure 4:
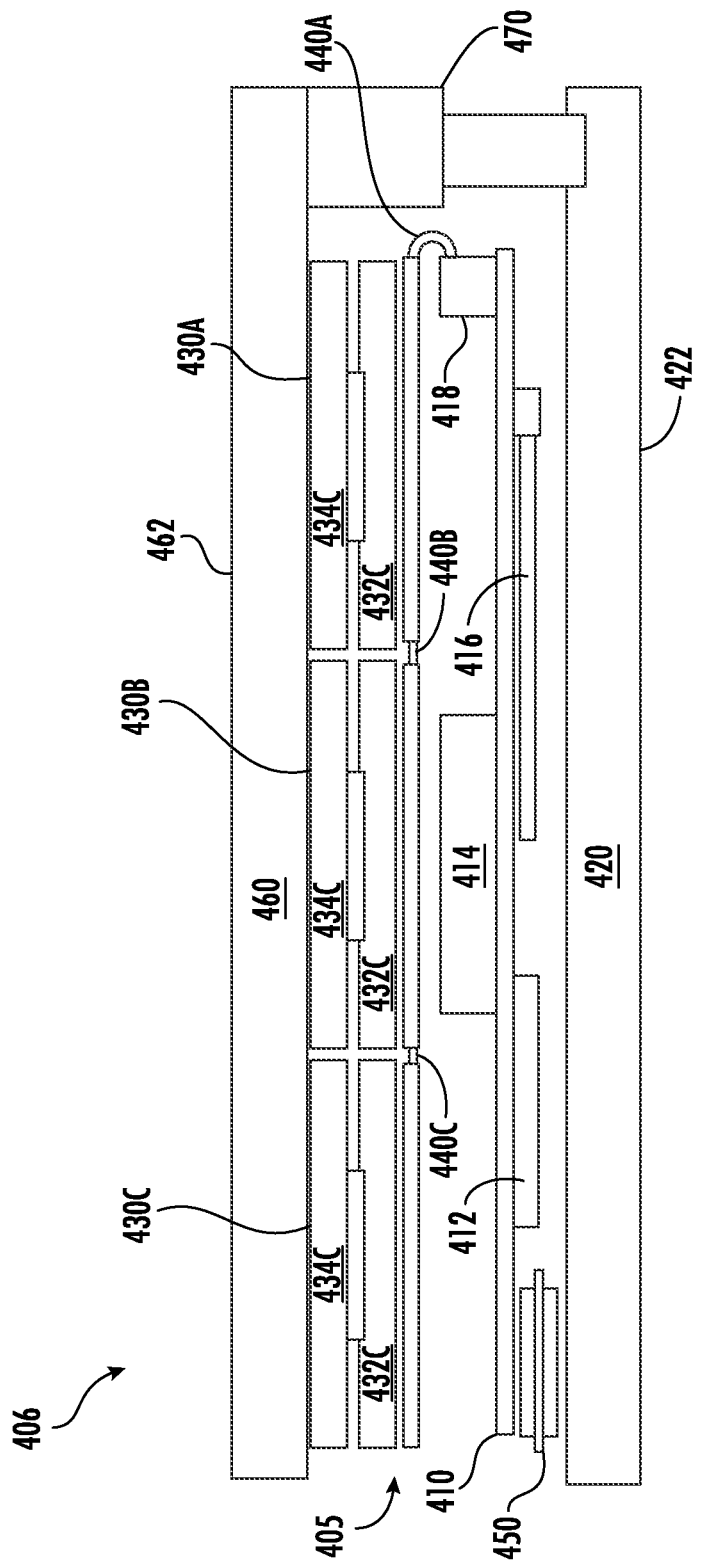
FIG. 4 depicts a side view of an example autonomous vehicle computing system according to example aspects of the present disclosure.

Referring now to FIG. 4, an additional computing system 400 according to additional aspects of the present disclosure is depicted. The computing system 400 can correspond to, for example, the vehicle computing system 105 and/or components of a computing system 200 depicted in FIGS. 1 and 2. For example, as shown, a computing device 405 can be mounted to two substantially parallel cooling baseplates 420 and 460.

For example, as shown, a processor blade 410 is positioned on a planar cooling surface of the first cooling baseplate 420 and three coprocessor blades 430A-C of a coprocessor carrier are positioned on planar cooling surface of a second cooling baseplate 460. While the first cooling baseplate 420 and second cooling baseplate 460 are shown in FIG. 4 as providing cooling to the processor blade 410 and coprocessor blades 430A-C, respectively, the first cooling baseplate 420 and the second cooling baseplate 460 can be configured to provide cooling to either the processor blade 410 or the coprocessor blades 430A-C. As shown, the coprocessor blade 410 can further include additional components, such as a storage device (e.g., an SSD) 416, and a memory module 414.

The first cooling baseplate 420 and the second cooling baseplate 460 can be connected by a hinge 470. For example, The first cooling baseplate 420 and second cooling baseplate 460 can each include an external housing 422/462, respectively, and the hinge 470 can allow the first cooling baseplate and second cooling baseplate to pivotably open such that the first external housing 422 and second external housing 462 can lay flat in a substantially common plane (not depicted). Further, the external housings 422/462 can protect the computing device(s) 405 contained within the computing system 400 while the computing system is pivotably closed, as shown in FIG. 4. For example, a fastener, such as a mechanical fastener (not shown) can fasten the first cooling baseplate and the second cooling baseplate together when the hinge is pivotably closed such that the first external housing and the second external housing are substantially oriented in two parallel planes, as depicted in FIG. 4.

Each of the cooling baseplates 420/460 can include an inlet and an outlet, and one or more cooling channels coupled between the respective inlets and outlets to allow a cooling fluid to flow between the inlet and outlet and provide cooling to the respective cooling surfaces, as described herein. According to additional example aspects of the present disclosure, the computing system 400 can include a cooling fluid connector coupled between the outlet of the first cooling baseplate 420 and the inlet of the second cooling baseplate 460 (or vice versa) to allow for a cooling fluid to flow from the first cooling baseplate 420 to the second cooling baseplate 460 (or vice versa). For example, in some implementations, the cooling fluid connector can be a flexible hose. In some implementations, the flexible hose can be incorporated into a hinge 470. Thus, the cooling fluid can be provided to a first cooling baseplate 420 and flow to a second cooling baseplate 460 via the cooling fluid connector (or vice versa).

A first flexible connector 440A connects the coprocessor blade 410 to a first coprocessor blade 430A. For example, the flexible connector 440A can plug into a connector 418 on the processor blade 410. Similar connectors (not shown) can be included on the coprocessor blades 430A-C and/or a flexible connector 440 can be incorporated into one or more coprocessor blades 430 of the coprocessor carrier, as described herein. A second flexible connector 430B can connect the first coprocessor blade 430A to the second coprocessor blade 430B, and a third flexible connector 440C can connect the second coprocessor blade 430B to the third coprocessor blade 430C. Each of the coprocessor blades 430A-C can include a respective coprocessor 432A-C, which can be coupled to a respective heat spreader 434A-C.

According to additional aspects of the present disclosure, a busbar 450 can be configured to provide electric power to the computing device 405. As depicted, the busbar 450 is mounted on the first cooling baseplate 420. However, in other implementations, the busbar 450 can be mounted on or adjacent to either of the cooling baseplates, including on the second cooling baseplate 460 In some implementations, the busbar 450 can span a length of the cooling baseplate 420/450 such that each computing device 405 can connect to the busbar 450. In some implementations, one or more insulative grommets can be used to couple the busbar to the cooling baseplate 420.

As shown, the processor blade 410 is coupled to the busbar 450, thereby allowing for electric power to be provided to the processor blade 410. Electric power can be provided from the processor blade 410 to each of the coprocessor blades 430A-C via the respective flexible connectors 440A-C in a daisy-chain configuration. In an implementation in which the busbar 450 is positioned on the second cooling baseplate 460, one of the coprocessor blades 430A-C can be coupled to the busbar 450, and the flexible connectors 440A-C can transfer electric power from the powered coprocessor blade 430 to the other the coprocessor blade(s) 430 and the processor blade 410.

In some implementations, the cooling baseplate 420/460 can further be configured to act as a ground for the computing device(s) 405. For example, the busbar 450 can be configured to provide regulated power (e.g., 12V DC power) and can be electrically isolated from the cooling baseplates 420/460, such as by using insulative mounting components. Each processor blade 410 and coprocessor blade 430 can then include a ground, which can be coupled to the cooling baseplates 420/460. Additionally, the cooling baseplates 420/460 can be electrically coupled, such as via grounding wire or via a hinge 470. In this way, the cooling baseplates 420/460 can act as a ground, which can help to reduce electromagnetic interference (EMI) and improve signal quality for the computing system. Moreover, this can help to reduce galvanic corrosion of the cooling baseplates 420/460, as the grounded cooling baseplates 420/460 will not have any electric potential (e.g., positive or negative voltage).

Figure 5:
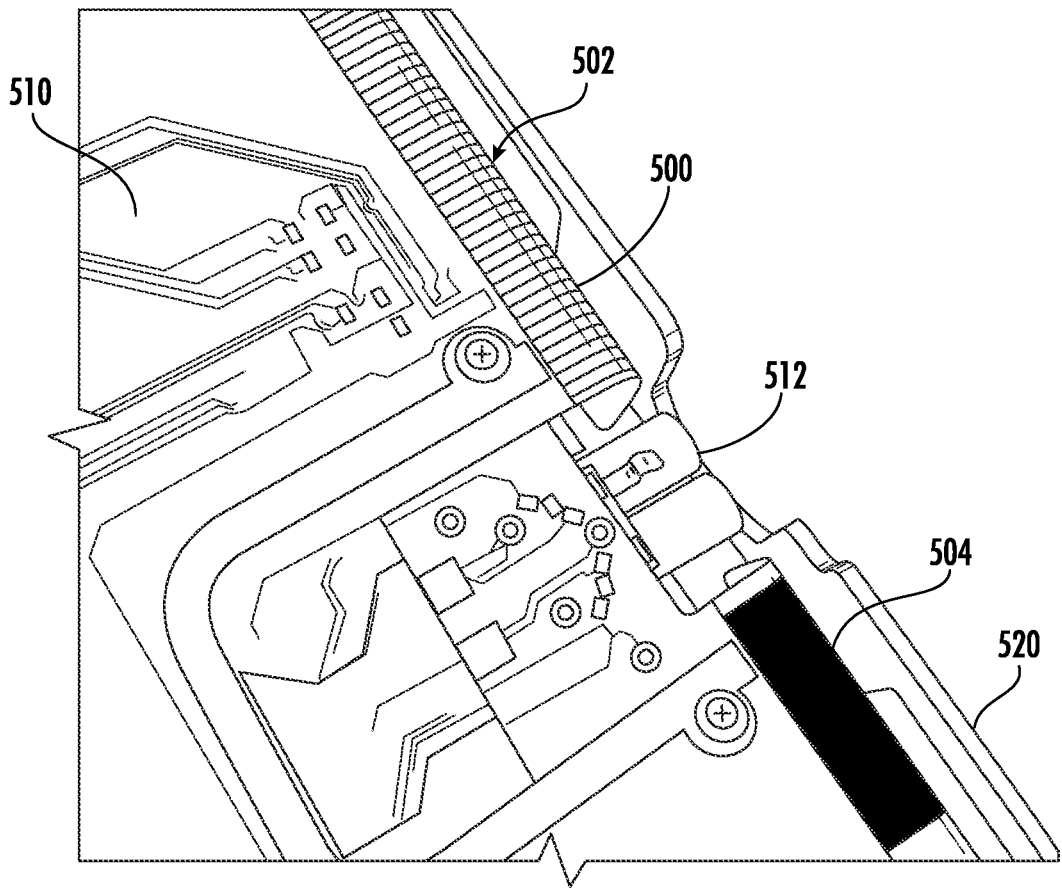
FIG. 5 depicts an example flexible connector attached to a computing device according to example aspects of the present disclosure.

Referring now to FIG. 5, an example flexible connector 500 attached to a computing device according to example aspects of the present disclosure is depicted. The flexible connector 500 can correspond to a flexible connector as described with reference to FIGS. 2-4. As shown, a first portion 502 of a flexible connector 500 can include individual copper strands which can correspond to individual pins on a connector (not shown). The individual strands can be configured to allow for data communication between processor blades, coprocessor blades, or any combination thereof. Further, a second portion 504 of the flexible connector 500 can include one or more wide layers of copper which can be configured to allow for electric power transfer between processor blades, coprocessor blades, or any combination thereof. The wide layer(s) can correspond to a plurality of pins on a connector which are used for electric power transfer.

As depicted in FIG. 5, the flexible connector 500 is connected to a processor or coprocessor blade 510. In some implementations, the processor/coprocessor blade 510 can include a port 512 for a sensor, such as a camera or LIDAR sensor. Additionally, in some implementations, a housing 520 can be included to protect the computing system (or a portion thereof). In some implementations, such as an implementation in which two cooling baseplates are used as depicted in FIG. 4, the housing can correspond to an outer portion of the cooling baseplates.

Figure 6:
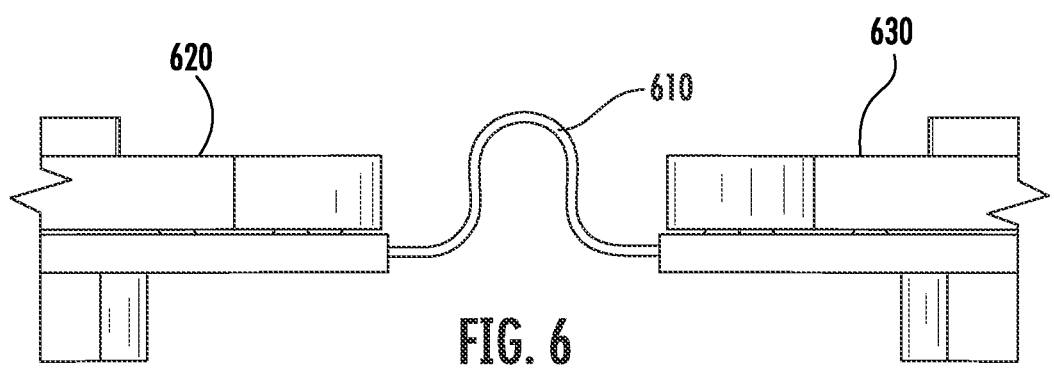
FIG. 6 depicts an example flexible connector with a preformed bend according to example aspects of the present disclosure.

Referring now to FIG. 6, an example flexible connector 610 incorporating a preformed bend is depicted. The flexible connector 610 can correspond to a flexible connector as described with reference to FIGS. 2-5. The preformed bend in the flexible connector 610 can be, for example, a U-shaped bend (e.g., an approximately 180 degree bend) with two corresponding L-shaped bends (e.g., approximately 90 degree bends) to allow for the flexible connector 610 to flex and adjust as needed to allow for different coprocessor blades to be included in a computing system.

For example, the flexible connector 610 can be coupled between a first coprocessor blade 620 and a second coprocessor blade 630. Each of the coprocessor blades 620/630 can include different coprocessors, which may cause the coprocessor blades 620/630 to have a variation in a mounting height. For example, a FPGA coprocessor blade may have a different thickness than a GPU coprocessor blade and/or two GPU coprocessor blades may have different thicknesses. Further, manufacturing tolerances may further cause thickness variations in coprocessor blades. These thickness variations as well as any mounting hardware, such as specific load spreaders, fasteners, etc. can cause a variation in a mounting height between the coprocessor blades 620/630. A flexible connector 610 with a preformed bend, as depicted in FIG. 6 can allow for a variation in the mounting height between the coprocessor blades 620/630 without causing additional stress to the coprocessor blades 620/630. For example, if a coprocessor blade (e.g., a single PCB) incorporating a plurality of coprocessors with different thicknesses was fastened to a cooling baseplate, stress caused by the thickness variations could cause the PCB to deform, bend, and in some cases, fracture. The preformed bends in a flexible connector 610, however, can compensate for these thickness variations without causing any additional stress on the individual coprocessor blades 620/630.

Figure 7:
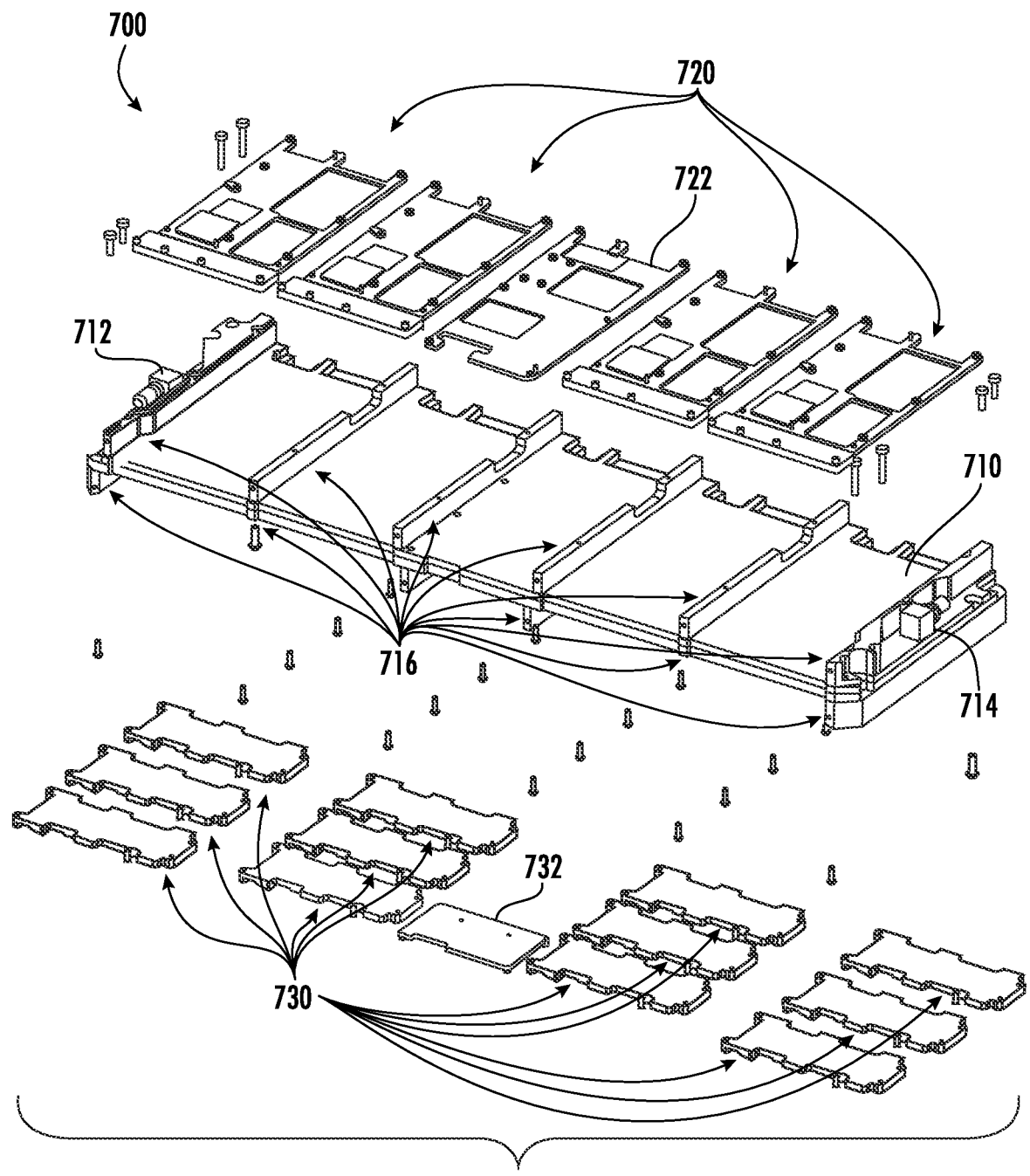
FIG. 7 depicts an exploded view of an example autonomous vehicle computer cooling system according to example aspects of the present disclosure.

Referring now to FIG. 7, an exploded view of an example computer cooling system 700 according to example aspects of the present disclosure is depicted. The computer cooling system 700 can correspond to, for example, components of the vehicle computing system 105, computing system 200, and computing system 300 depicted in FIGS. 1-3.

As shown, a plurality of heat spreaders can be coupled to a cooling baseplate 710. For example, each computing device can include a processor blade and one or more coprocessor blades, as described herein, and can be coupled to a respective processor blade heat spreader 720 and/or coprocessor blade heat spreader(s) 730. For example, the processor blades (not shown) and coprocessor blades (not shown) of each computing device can be coupled to respective processor blade heat spreaders 720 and coprocessor blade heat spreaders 730, which can further be coupled to the cooling baseplate 710 via one or more fasteners (e.g., screws), as depicted in the exploded view of the computing system 700. As shown, four processor blade heat spreaders 720 are depicted, as well as 3 coprocessor blade heat spreaders 730 for each processor blade, for a total of 12 coprocessor blade heat spreaders 730. A processor switch (not shown) can couple to a processor switch heat spreader 722 and a coprocessor switch (not shown) can couple to a coprocessor switch heat spreader 732. The processor and coprocessor switches can each be a high-speed switch which can facilitate data connections between processor blades and coprocessor blades. The cooling baseplate 710 can also include an inlet 712 and an outlet 714, with one or more cooling channels coupled between the inlet 712 and the outlet 714, as described herein.

According to additional example aspects of the present disclosure, one or more ribs 716 can also be included in a cooling baseplate 710. As shown, the one or more ribs 716 can be positioned at the ends of the cooling baseplate 710 as well as between adjacent processor blades 720, coprocessor blades 730, and switches 722/732. The one or more ribs 716 can provide structural support for the computing system. In some implementations, the one or more ribs 716 can be fastened to the cooling baseplate 710, such as by using mechanical fasteners (e.g., screws). For example, the one or more ribs 716 can be positioned on the planar cooling surfaces of the cooling baseplate 710. Further, the one or more ribs can provide a mounting structure for an external housing, such as the external housing depicted in FIGS. 5 and 9.

Figure 8:
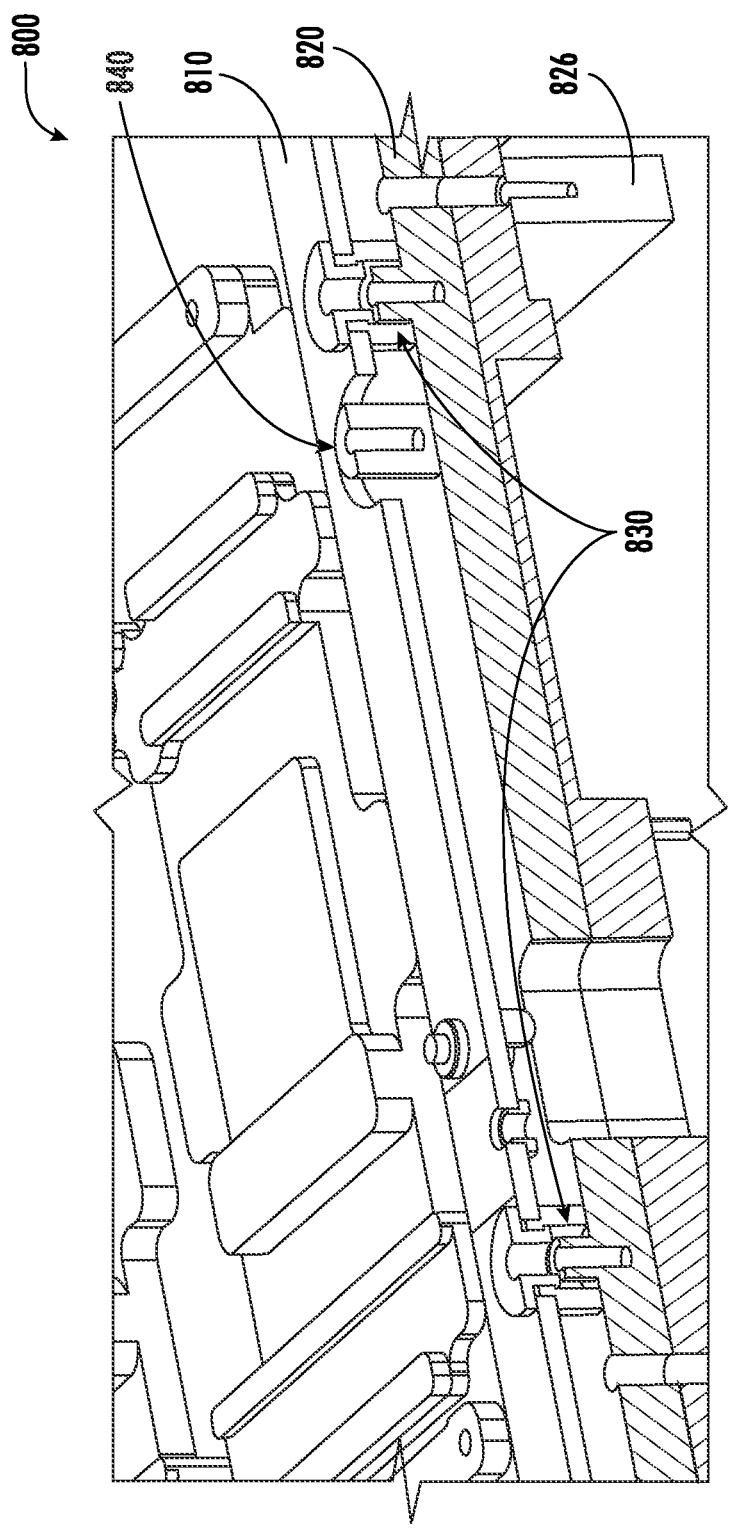
FIG. 8 depicts an example busbar mounted to a cooling baseplate according to example aspects of the present disclosure.

Referring now to FIG. 8, a portion of an example busbar mounting configuration for a computing system 800 is depicted. The computing system 800 can correspond to, for example, the vehicle computing system 105, computing system 200-400 and 700 depicted in FIGS. 1-4, and 7. For example, as shown, a busbar 810 can be mounted to a cooling baseplate 820, such as on a planar cooling surface of the cooling baseplate 820. In some implementations, the busbar 810 can be configured to provide regulated power (e.g., $_{12}$V DC power) to processor blades and/or coprocessor blades. Flexible grommets 830 can be used to electrically isolate the busbar 810 from the cooling baseplate 820. For example, in some implementations, the flexible grommets 830 can be constructed out of rubber or other insulative material. This can allow for the cooling baseplate 820 to act as a ground for the computing system 800. For example, one or more studs 840 can be incorporated into the cooling baseplate 820 to allow for the grounding of each computing device in the computing system 800 (e.g., each processor blade and/or coprocessor blade coupled to the cooling baseplate 820). In this way, the cooling baseplate 820 can act as a ground, which can help to reduce electromagnetic interference (EMI) and improve signal quality for the computing system 800. Moreover, this can help to reduce galvanic corrosion of the cooling baseplate 820, as the grounded cooling baseplate 820 will not have any electric potential (e.g., positive or negative voltage).

Figure 9:
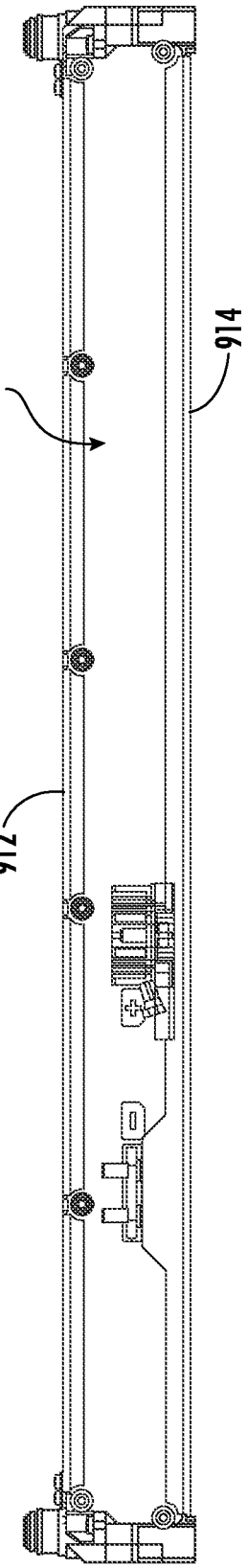
FIG. 9 depicts an example autonomous vehicle computing system with a housing according to example aspects of the present disclosure.

Referring now to FIG. 9, an example computing system 900 incorporating a housing 910 is depicted. In some implementations, the housing can be mounted to one or more ribs, as described herein. For example, one or more fasteners (e.g., clips, screws, spring-loaded screws, etc.) can secure the housing 910 to the ribs. In some implementations, the housing 910 can include a top cover 912 secured over the first planar cooling surface, and a bottom cover 914 secured over the second planar cooling surface of a cooling baseplate. The ribs and the housing can together increase the structural integrity of the computing system 900.

In some implementations, such as an implementation in which two cooling baseplates are used as depicted in FIG. 4, the housing 910 can correspond to an outer portion of the cooling baseplates.

Figure 10:
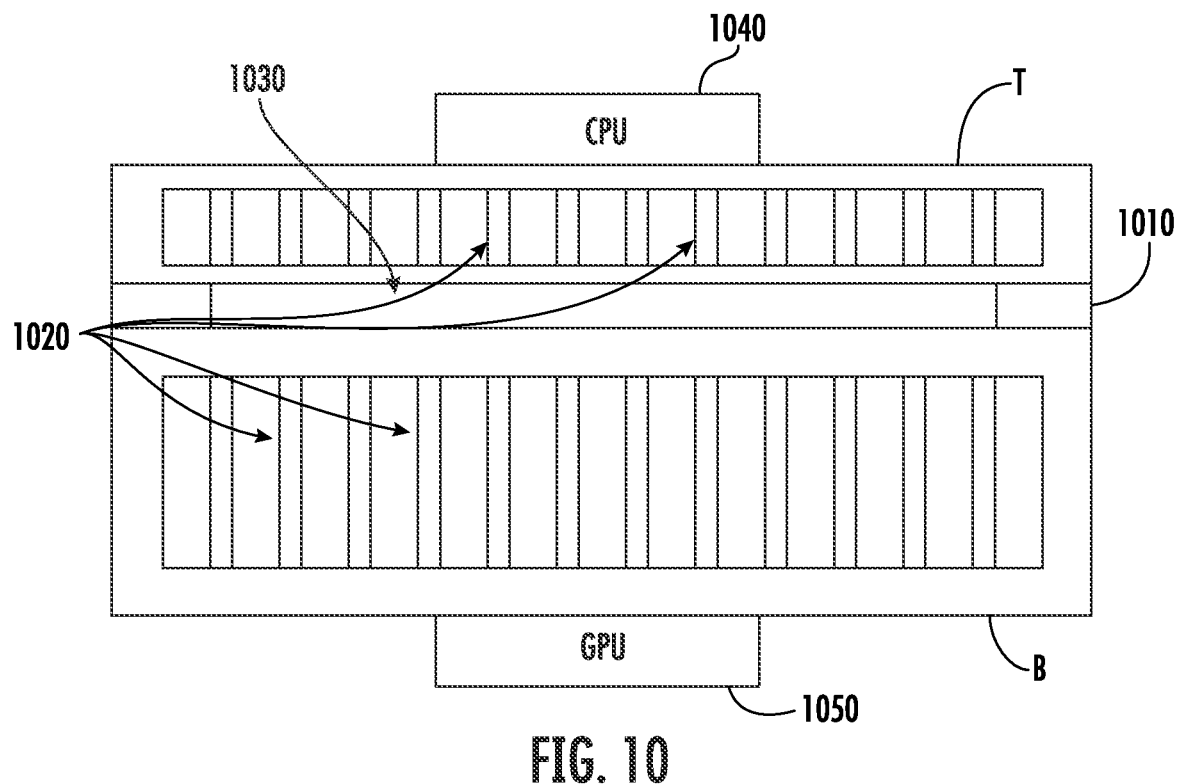
FIG. 10 depicts an example cross section view of a cooling baseplate including a plurality of cooling channels and an air gap according to example aspects of the present disclosure.

Referring now to FIG. 10, an example cross section view of a cooling baseplate 1010 including a plurality of cooling channels 1020 and an air gap 1030 according to example aspects of the present disclosure is depicted. For example, a processor blade 1040 can be coupled to a first planar cooling surface T of the cooling baseplate 1010, and a coprocessor blade 1050 can be coupled to a second planar cooling surface B of the cooling baseplate 1010. Each of the processor blade 1040 and the coprocessor blade 1050 can have a subset of cooling channels 1020 positioned on an opposite side of the respective planar cooling surface B and T, through which a cooling fluid can flow, as described herein. The air gap 1030 (e.g., an open portion) can be positioned between the subsets of cooling channels to prevent or reduce "crosstalk" (e.g., heat transfer) between the cooling fluid circulated in the respective subsets of cooling channels.

Figure 11:
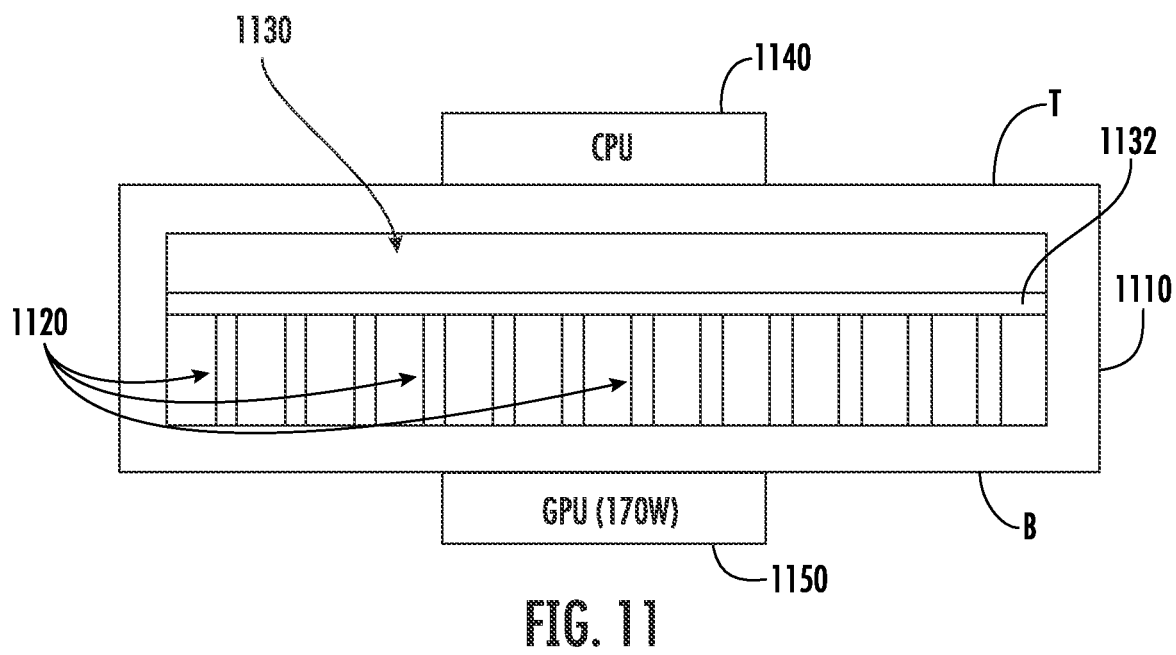
FIG. 11 depicts an example cross section view of a cooling baseplate including a plurality of cooling channels and a fluid gap according to example aspects of the present disclosure.

Referring now to FIG. 11, an example cross section view of a cooling baseplate 1110 including a plurality of cooling channels 1120 and a fluid gap 1130 according to example aspects of the present disclosure is depicted. For example, a processor blade 1140 can be coupled to a first planar cooling surface T of the cooling baseplate 1110, and a coprocessor blade 1150 can be coupled to a second planar cooling surface B of the cooling baseplate 1110. Each of the processor blade 1140 and the coprocessor blade 1150 can have a subset of cooling channels 1120 positioned on an opposite side of the respective planar cooling surface B and T, through which a cooling fluid can flow, as described herein. However, the processor blade 1140 can have a fluid gap 1130 which can be a dedicated cooling channel positioned under the first planar cooling surface T. The fluid gap 1130 can be created by a wall 1132 which can isolate the cooling fluid cooling providing cooling to the processor blade 1140 from the cooling fluid providing cooling to the coprocessor blade 1150. Stated differently, the fluid gap 1130 can be one or more cooling channels configured to provide cooling to a first planar cooling surface which are isolated from one or more cooling channels providing cooling to a second planar cooling surface. This can similarly prevent or reduce "crosstalk" (e.g., heat transfer) between the cooling fluid providing cooling to the processor blade(s) 1140 and coprocessor blade(s) 1150.

Referring generally to both FIGS. 10 and 11, the cooling baseplates 1010/1110 can be used in either a single cooling baseplate implementation as depicted in FIGS. 2, 3, and 7, and/or a double cooling baseplate implementation as depicted in FIG. 4. In some implementations, the cooling baseplates 1010/1110 can include a plurality of pin fins positioned within the one or more cooling channels 1020/1120. The pin fins can be configured to transfer heat from the processor blade(s) 1040/1140 and coprocessor blade(s) 1050/1150 to the cooling baseplates 1010/1110. For example, as the cooling fluid flows through the one or more cooling channels 1020/1120 of the cooling baseplates 1010/1110, a plurality of pin fins can be positioned within the one or more cooling channels 1010/1110 to aid in heat transfer from processor blade(s) 1040/1140 and coprocessor blade(s) 1050/1150. For example, in some implementations, a subset of pin fins can be positioned within the one or more cooling channels 1010/1110 proximate to processor or coprocessor of a processor blade 1040/1140 or coprocessor blade 1050/1150. In some implementations, the pin fins can be machined, milled, cast, or otherwise included in the cooling baseplate 1010/1110 such that the pin fins can extend from a planar cooling surface into the one or more cooling channels 1010/1110.

In some implementations, the pin fins can be diamond-shaped pin fins. For example, in some implementations, diamond-shaped pin fins can be milled into a cooling baseplate 1010/1110 and can be arranged in a grid-like pattern. For example, in some implementations, the diamond-shaped pin fins can have an angle of approximately 30 degrees on a leading edge of the pin fin to aid in diverting the cooling fluid flow around the diamond-shaped pin fins without overly impeding the flow of the cooling fluid or causing too large of a pressure drop. An advantage provided by diamond-shaped pin fins is that the pin fins can be milled into a cooling baseplate 1010/1110.

In some implementations, the pin fins can include rounded pin fins. For example, in some implementations, rounded pin fins can generally have a rounded shape (i.e., a circular or oval shape). For example, rather than having an angled leading edge such as on a diamond-shaped pin fin, the rounded pin fins can have a curved or rounded shape. An advantage provided by rounded pin fins is that as the cooling fluid flows around the rounded pin fins, a turbulence in the cooling fluid flow can be created, which can assist in additional heat transfer. In some implementations, the pin fins can be folded pin fins, such as in a brazed cooling baseplate 1010/1110 application.

Computing tasks, operations, and functions discussed herein as being performed at one computing system herein can instead be performed by another computing system, and/or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implemented tasks and/or operations can be performed sequentially or in parallel. Data and instructions can be stored in a single memory device or across multiple memory devices.

The communications between computing systems described herein can occur directly between the systems or indirectly between the systems. For example, in some implementations, the computing systems can communicate via one or more intermediary computing systems. The intermediary computing systems may alter the communicated data in some manner before communicating it to another computing system.

The number and configuration of elements shown in the figures is not meant to be limiting. More or less of those elements and/or different configurations can be utilized in various embodiments.

While the present subject matter has been described in detail with respect to specific example embodiments and methods thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A cooling system for an autonomous vehicle control system, the cooling system comprising:
    a first cooling baseplate comprising:
        a first cooling surface of the first cooling baseplate,
        a second cooling surface of the first cooling baseplate, the second cooling surface of the first cooling baseplate being opposite the first cooling surface of the first cooling baseplate,
        an inlet of the first cooling baseplate, and
        an outlet of the first cooling baseplate coupled to the inlet of the first cooling baseplate through one or more cooling channels;
    a second cooling baseplate comprising:
        a first cooling surface of the second cooling baseplate,
        a second cooling surface of the second cooling baseplate, the second cooling surface of the second cooling baseplate being opposite the first cooling surface of the second cooling baseplate,
        an inlet of the second cooling baseplate, and
        an outlet of the second cooling baseplate coupled to the inlet of the second cooling baseplate through one or more cooling channels; and
    a cooling fluid connector coupled between the outlet of the first cooling baseplate and the inlet of the second cooling baseplate.

2. The cooling system of claim 1, wherein the inlet of the first cooling baseplate and the outlet of the second cooling baseplate are couplable to a cooling fluid source.

3. The cooling system of claim 1, wherein the cooling fluid connector comprises a flexible house.

4. The cooling system of claim 1, wherein at least one of the first cooling baseplate or the second cooling baseplate further comprise one or more busbars configured to output electrical power.

5. The cooling system of claim 4, wherein the one or more busbars comprise:
    a first busbar mounted on the first cooling surface of the respective cooling baseplate; and
    a second busbar mounted on the second cooling surface of the respective cooling baseplate.

6. The cooling system of claim 5, wherein the first busbar has a length of the first cooling surface of the respective cooling baseplate or the second busbar has a length of the second cooling surface of the respective cooling baseplate.

7. The cooling system of claim 1, wherein at least one of the first cooling baseplate or the second cooling baseplate further comprises a plurality of pin fins positioned within the one or more cooling channels.

8. The cooling system of claim 1, wherein the first cooling baseplate is coupled to the second cooling baseplate through a hinge.

9. The cooling system of claim 1, wherein at least one of the first cooling baseplate or the second cooling baseplate further comprises one or more ribs disposed along at least one of the first cooling surface and the second cooling surface.

10. The cooling system of claim 1, wherein for at least one of the first cooling baseplate or the second cooling baseplate:

the first cooling surface comprises a first flat two-dimensional surface and the second cooling surface comprises a second flat two-dimensional surface.

11. An autonomous vehicle comprising:
a cooling system comprising:
- a first cooling baseplate comprising:
  - a first cooling surface of the first cooling baseplate,
  - a second cooling surface of the first cooling baseplate, the second cooling surface of the first cooling baseplate being opposite the first cooling surface of the first cooling baseplate,
  - an inlet of the first cooling baseplate, and
  - an outlet of the first cooling baseplate coupled to the inlet of the first cooling baseplate through one or more cooling channels;
- a second cooling baseplate comprising:
  - a first cooling surface of the second cooling baseplate,
  - a second cooling surface of the second cooling baseplate, the second cooling surface of the second cooling baseplate being opposite the first cooling surface of the second cooling baseplate,
  - an inlet of the second cooling baseplate, and
  - an outlet of the second cooling baseplate coupled to the inlet of the second cooling baseplate through one or more cooling channels; and
- a cooling fluid connector coupled between the outlet of the first cooling baseplate and the inlet of the second cooling baseplate.

12. The autonomous vehicle of claim 11, further comprising:
a cooling fluid source coupled between the inlet of the first cooling baseplate and the outlet of the first cooling baseplate.

13. The autonomous vehicle claim 12, wherein the cooling fluid source comprises a cooling liquid source.

14. The autonomous vehicle of claim 11, wherein the cooling fluid connector comprises a flexible house.

15. The autonomous vehicle of claim 11, wherein the cooling system further comprises:
a first housing in which the first cooling baseplate is disposed; and
a second housing in which the second cooling baseplate is disposed.

16. The autonomous vehicle of claim 15, wherein at least one of the first housing or the second housing comprises:
a first cover; and
a second cover, the first cover coupled to the first cooling surface of the respective cooling baseplate, the second cover coupled to the second cooling surface of the respective cooling baseplate.

17. The autonomous vehicle of claim 16, wherein the first cover is coupled to one or more ribs on the first cooling surface of the respective cooling baseplate and the second cover is coupled to one or more ribs on the second cooling surface of the respective cooling baseplate.

18. The autonomous vehicle of claim 11, wherein at least one of the first cooling baseplate or the second cooling baseplate further comprise one or more power distributors configured to output electrical power.

19. The autonomous vehicle of claim 11, wherein the first cooling baseplate is coupled to the second cooling baseplate through a hinge.

20. An autonomous vehicle comprising:
a vehicle control system; and
a cooling system for the vehicle control system, the cooling system comprising:
- at least a first cooling baseplate and a second cooling baseplate, the first cooling baseplate and the second cooling baseplate each comprising:
  - at least a first cooling surface and a second cooling surface, the second cooling surface being opposite the first cooling surface;
  - an inlet; and
  - an outlet coupled to the inlet through one or more cooling channels;
- a cooling fluid connector coupled between the outlet of the first cooling baseplate and the inlet of the second cooling baseplate.

* * * * *